United States Patent [19]

Kobayashi et al.

[11] Patent Number: 4,829,022
[45] Date of Patent: May 9, 1989

[54] METHOD FOR FORMING THIN FILMS OF COMPOUND SEMICONDUCTORS BY FLOW RATE MODULATION EPITAXY

[75] Inventors: Naoki Kobayashi, Iruma; Hideo Sugiura, Katsuta; Yoshiji Horikoshi, Akishima, all of Japan

[73] Assignee: Nippon Telegraph and Telephone Corporation, Tokyo, Japan

[21] Appl. No.: 88,641

[22] PCT Filed: Dec. 9, 1986

[86] PCT No.: PCT/JP86/00623

§ 371 Date: Aug. 5, 1987

§ 102(e) Date: Aug. 5, 1987

[87] PCT Pub. No.: WO87/03740

PCT Pub. Date: Jun. 18, 1987

[30] Foreign Application Priority Data

Dec. 9, 1985 [JP] Japan .................................. 60-276417
Sep. 9, 1986 [JP] Japan .................................. 61-210634
Sep. 12, 1986 [JP] Japan .................................. 61-214049
Sep. 26, 1986 [JP] Japan .................................. 61-226093
Dec. 5, 1986 [JP] Japan .................................. 61-288865

[51] Int. Cl.$^4$ .......................................... H01L 21/203
[52] U.S. Cl. .......................... 437/107; 148/DIG. 65;
148/DIG. 72 DIG. 110; 148/DIG. 169;
148/DIG. 160; 156/612; 437/110; 437/126;
437/949

[58] Field of Search .................... 148/DIG. 48, 56, 65,
148/110, 72, 169, 97; 156/611-615; 437/88, 95,
96, 104, 107, 110, 126, 137, 887, 949

[56] References Cited

U.S. PATENT DOCUMENTS

| | | | |
|---|---|---|---|
| 3,915,765 | 10/1975 | Cho et al. ............................ | 437/107 |
| 4,128,733 | 12/1978 | Fraas et al. ......................... | 437/104 |
| 4,330,360 | 5/1982 | Kubiak ................................ | 156/610 |
| 4,504,331 | 3/1985 | Kuech et al. ....................... | 156/613 |
| 4,508,430 | 11/1985 | Suntola et al. ...................... | 156/611 |
| 4,584,028 | 4/1986 | Pankove et al. ..................... | 427/39 |
| 4,615,102 | 10/1986 | Suzuki et al. ....................... | 437/107 |
| 4,629,514 | 12/1986 | Suda ................................... | 437/81 |

FOREIGN PATENT DOCUMENTS 215436 3/1987 European Pat. Off. .
2391769 12/1978 France .

OTHER PUBLICATIONS

Frass et al., "Epitaxial Growth from Organometallic Sources in High Vacuum", J. Vac. Sci. Technol. B4(1), Jan./Feb. 1986, pp. 22–29.
Frass, "A New Low Temperature III–IV . . . Vacuum Metalorganic Chemical Vapor Deposition", J. Appl. Phys. 52(11), Nov. 1981, pp. 6939–6943.
Panish et al., "Gas Source MBE of InP and Gax In$_{1-x}$-PyAs$_{1-y}$...", J. Vac. Sci. Technol. B3(2), Mar./Apr. 1985, pp. 657–665.
Tokumitsu et al., "Molecular Beam Epitaxial Growth of GaAs Using Trimethylgallium as a Ga Source", J. Appl. Phys. 55(8), Apr. 15, 1984, pp. 3163–3165.

(List continued on next page.)

Primary Examiner—Brian E. Hearn
Assistant Examiner—William D. Bunch
Attorney, Agent, or Firm—Spencer & Frank

[57] ABSTRACT

A method of forming a III-V semiconductor on the surface of a substrate which is placed in a vacuum chamber and is heated, by supplying one element of Group III and one element of Group V of the periodic table in the form of atoms or molecules to the surface of the substrate. The supply of the element of Group V is decreased to a small quantity insufficient to form a III-V compound semiconductor at least at one period of the growth of the III-V compound, and the element of Group V in the small quantity and the element of Group III are supplied to the surface of the substrate. This method makes it possible to grow III-V compound epitaxial layers which have a high degree of purity and fewer crystal defects and in which surfaces and the interfaces of the heterojunctions are flat on an atomic scale, at a wide temperature range. The present invention can be used for the fabrication of various optical devices and super-high-speed electronic devices.

20 Claims, 19 Drawing Sheets

OTHER PUBLICATIONS

Bachrach, "On the Possibility of MBE Growth Interface Modification by Hydrogen", J. Vac. Sci., Technol. B1(2), Apr./Jun. 1983, pp. 142-145.
Fraas et al., "Epitaxial Films Grown by Vacuum MOCVD", J. Crystal Growth, 68 (1984), pp. 490-496.
Nishizawa et al., "Molecular Layer Epitaxy", J. Electrochem. Soc., vol. 139, May 1985, pp. 1197-1200.
Parker, "The Technology and Physics of Molecular Beam Epitaxy", Plenum Press, New York, 9/1985, pp. 30-31, 62.
Chang, L. L. et al.; J. Vac. Sci, Technol, vol. 10, p. 11, 1973.
Neave, J. H. et al.; Appl. Phys. Lett., vol. 47, p. 100, 1985.
Sakaki, H. et al., Japan, J. Appl. Phys., vol. 24, L. 417, 1985.
Inst. Phys. Conf. Ser. No. 79; Chapter 13; pp. 737-738, 1985.
Japan, J. Appl. Phys., vol. 23, No. 9, pp. L657-L659, Sep., 1984.
Oyo Buturi, vol. 53, No. 6, pp. 516-520, Jun., 1984.
Neave, J. H. et al.; Appl. Phys. A31 May., 1983.
"Atomic Layer Epitaxy of ZnSe an ZnTe Single Crystalline Films and its Application to the Fabrication of ZnSe/ZnTe Superlattices", Extended Abstracts of the 17th Conference on Solid State Devices and Materials, Tokyo 1985, pp. 221-224.
"Epitaxial Structures with Alternate-Atomic-Layer Composition Modulation", Applied Physics Letters, vol. 29, No. 6, Sep. 15, 1976, pp. 323-325.
"GaAs Atomic Layer Epitaxy by Hydride VPE", Usui et al., Japanese Journal of Applied Physics, vol. 25, No. 3, Mar. 1986, pp. L212-L214.

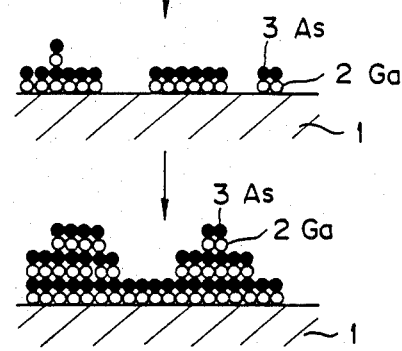
FIG. 1A
FIG. 1B
FIG. 1C
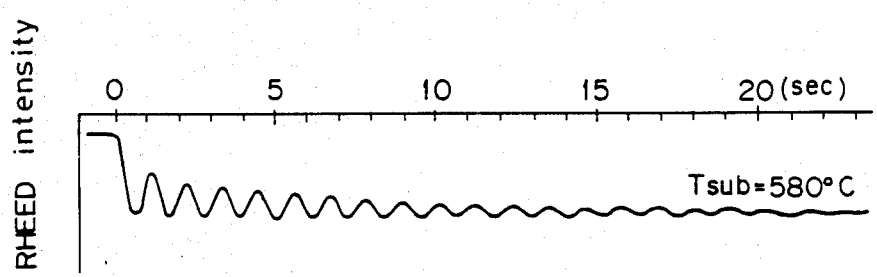
FIG. 2

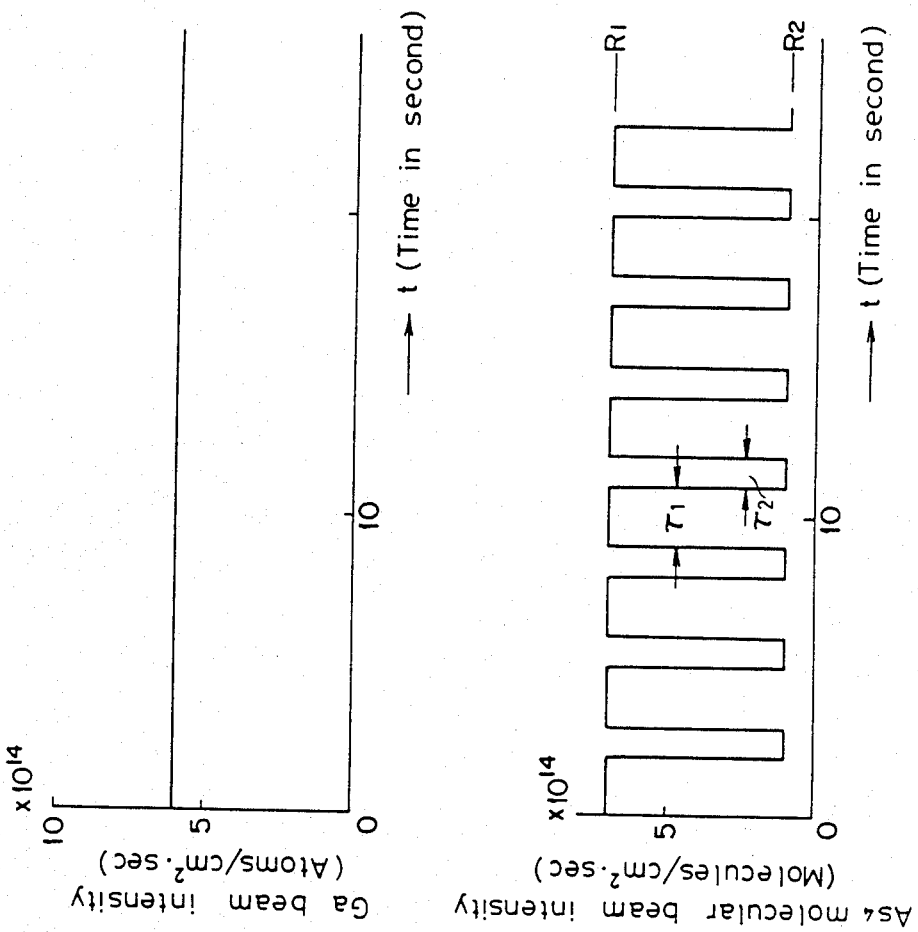

METHOD FOR FORMING THIN FILMS OF COMPOUND SEMICONDUCTORS BY FLOW RATE MODULATION EPITAXY

TECHNICAL FIELD

The present invention relates to a method for forming thin III-V compound semiconductor films and more particularly a method for forming not only thin III-V compound films in which each atomic layer has a flat grown surface but also multilayer thin film structures in which each atomic layer has a flat surface and a heterojunction interface at which elements of compounds are sharply distributed.

BACKGROUND ART

Compound semiconductors have been noted as the most suitable semiconductors for obtaining semiconductor devices which can satisfy recent demands for super high-speed operation and high performance. In some compound semiconductors, semiconductor mixed crystals can be synthesized which passes the zinc-blende crystal structure, and it is possible to obtain heterojunctions at which lattice matching between various dissimilar semiconductor crystal is achieved. Therefore, by utilizing such heterojunctions, devices such as ultrahigh-speed electronic devices utilizing modulated doping, various optical devices such as laser diodes and novel electronic devices utilizing the superlattice structure have been developed and some of them have been already used in practice.

Furthermore, novel devices utilizing the new physical properties of such heterojunction structures or superlattice structures and especially compound semiconductor devices typically represented by lasers and HEMT (high electron mobility transistors) have been recently extensively studied at high speed. Such elements comprise in general a substrate and a thin film which is formed on the substrate and have a complicated structure consisting of many layers of dissimilar compounds. And it is well known to those skilled in the art that the performance of these elements is greatly influenced by the structure of the thin film, especially the sharp distribution of composition or the sharp distribution of doping concentration at the interface between the adjacent layers.

It follows, therefore, that the most fundamental technique for fabricating the heterojunction structures or the superlattice structures is to grow the layers each in a desired thickness of different compounds in such a way that the interface between the adjacent layers can be defined as sharply as possible, without causing any crystal defect.

One process for growing a thin III-V compound semiconductor film over the surface of a substrate is molecular beam epitaxy (MBE).

In the case of growing a III-V compound crystal by the conventional MBE method, at least one element of Group III and at least one element of Group V of the periodic table are simultaneously supplied on the surface of a substrate which disposed in a vacuum chamber and heated. (Chang, L. L. et al.; J. Vac. Sci, Technol., Vol. 10, P. 11, 1973). In this case, in order to prevent the escape of the Group V element having a high vapor pressure from the grown layer, a large amount of the Group V element is normally supplied on the surface of the growing layer. As a result, the Group III element immediately combines with the Group V element on the growing surface so that III-V molecules are formed. In order to obtain a flat grown surface in each atomic layer, the molecules thus obtained must be sufficiently diffused over the grown surface. However, the diffusion coefficient of such molecules is extremely low as reported by Neave, J. H. et al. (Appl. Phys. Lett. Vol. 47, P. 100, 1985), so that small hills and small valleys which differ in height by a few atomic layers always exist on the grown surface as shown in FIGS. 1A-1C. In FIG. 1, reference numeral 1 represents a substrate; 2, Ga atoms; and 3, As atoms. The Ga-As molecules thus formed on the substrate 1 are gradually increased in number in the order of steps shown in FIGS. 1A, 1B and 1C, but as shown in FIG. 1B, the second Ga-As molecular layer is formed before the first Ga-As molecular layer has completely covered the surface of the substrate 1. Since the mobility of Ga-As molecules is low, the second and third Ga-As layers are formed before the second Ga-As molecular layer is displaced to fill the openings of the first Ga-As layer, so that part of the second and third Ga-As molecular layers tends to be directly adsorbed in the openings of the first Ga-As layer and consequently small hills and valleys are formed as shown in FIG. 1C.

The results of recent studies on MBE show that when a RHEED (reflection high energy electron diffraction) pattern is observed when growing a thin film, the intensity of the light from the diffraction pattern varies periodically in time and that the period is equal to the length of time required for growing one Ga-As layer. FIG. 2 shows the mode of oscillation, the intensity of light from the diffraction pattern being plotted along the ordinate while is plotted, along the abscissa. It is readily understood that the oscillations of the intensity of light are damped in time. In the conventional MBE method, prior to the growth of a layer, As molecules are supplied over the surface of the substrate and as a result of the heat treatment for a long period of time, the surface of the substrate becomes relatively flat in terms of an atomic layer. The intensity of RHEED before the growth of a film, that is, $t \leq 0$ represents the flatness of the surface of the substrate. When the supply of Ga atoms is started in addition to that of As molecules (that is, $t > 0$), the intensity of RHEED is rapidly reduced and then becomes a minimum level. The intensity of RHEED reflects the interference effect due to the surface roughness and the fact that the absolute value of the intensity of RHEED drops means that the ratio of the flat areas of the upper layers to those of the adjacent lower layers formed by respective steps becomes smaller. On the other hand, the reduction in amplitude of oscillations is a result of the increase in number of steps so that eventually only white noise signals are obtained. Therefore, the minimum level of RHEED means that one half of a single molecular layer has been grown and that the upper and lower surface areas of a step becomes substantially equal to each other. Thereafter, as the layer is grown further, the intensity of RHEED becomes a maximum level again. This means that just one molecular layer has been grown in a microscopic view.

It is very important to note the fact that the maximum value of each period is considerably lower than that of the preceding period. The reason is that since the mobility of the Ga-As molecules on the grown surface is not sufficient as described above with reference to FIGS. 1A-1C, a flat atomic surface cannot be reproduced after the growth of one molecular layer and steps of heights of one to a few atomic layers remain from point to point. The above-described tendency is further intensified as the growth of the film is increased, so that the oscillations of the intensity of RHEED disappear after the growth of tens of molecular layers as shown in FIG. 2. The reason is that many steps are formed on the grown surface as shown in FIG. 1C.

In the case of growing the thin film layers by the conventional MBE method, the grown surface is rough, that is, has little hills and valleys. As a result, when dissimilar semiconductor layers are grown over the grown surface so as to form a heterojunction interface, it cannot be avoided that the roughness of the interface of the heterojunction is intensified. Therefore, there has been proposed a method for accelerating the surface diffusion of molecules by interrupting the growth of the film and maintaining the grown layer at a high temperature (Sakaki, H. et al.; Japan. J. Appl. Phys. Vol. 24, L. 417, 1985). However, since the diffusion rate of the molecules is low inherently, the above-described method can improve the surface roughness to a small extent. Referring to FIGS. 3A–3C, the method for smoothing the surface of the grown layer by maintaining the surface at a high temperature according to the conventional process will be described in conjunction with the formation of the heterojunction by forming an AlAs layer over a GaAs layer. After a GaAs layer 4 has been grown to a predetermined thickness (FIG. 3A), the surface of the GaAs layer 4 is smoothed by thermally displacing "lands" of the thickness of one to three atomic layers on the surface of the GaAs layer 4 (FIG. 3B) and then the AlAs layer 5 is grown over the surface of the GaAs layer 4 (FIG. 3C).

However, according to the above-described process, the interface 6 of the heterojunction can be made flat within the range between a few μm to 100 μm, but in macroscopic view, the surface smoothness is increased as shown in FIG. 3C.

Because of the roughness of the interface of the heterojunction, devices such as quantum well semiconductor lasers and superlattice optical modulators which are constructed by various combinations of heterojunctions defined between the thin films are increased in breadth of spectrum and degraded in performance to a considerable extent. In order to improve the conventional MBE method, Japanese patent application Laid-Open No. 60-112692 discloses a method in which the Ga molecular beam and the As molecular beam are alternately irradiated on a GaAs substrate. However, according to this method between the As molecular beam irradiation period and the Ga molecular beam irradiation period, there is a period of time in which no molecule is irradiated, so that there is a danger that the As atoms escape from the grown crystal. Furthermore, it has the disadvantage that it takes a long period of time to grow a crystal.

Furthermore, the adverse effects caused by a low diffusion rate are further pronounced as the crystal growing temperature is lowered. For instance, it is impossible to obtain a high-quality epitaxially grown crystal of GaAs or InP at temperatures lower than 500° C. and it is also impossible to obtain a high-quality AlAs epitaxial crystal at a growing temperature lower than 600° C. Moreover, it becomes almost impossible to grow a GaAs or InP crystal at a temperature lower than 400° C. and it also becomes almost impossible to grow an AlAs crystal at a temperature lower than 450° C. As a result, the crystal growth is carried out at a high temperature so that diffusion of impurities results during the crystal growth. As a result, the distribution of impurities cannot be sharply defined and accordingly the characteristics of lasers, transistors and the like are limited to levels remarkably lower than their theoretical characteristics.

Another process for growing a thin III-V compound semiconductor film over the surface of a substrate is a metallo-organic chemical vapor deposition process (MOCVD). The same inventors improved MOCVD and proposed a method in which while a very small quantity of a hydride of an element of Group V is normally made to flow over the surface of a heated substrate together with a carrier gas, a metallo-organic compound containing an element of Group III and a hydride of an element of Group V which is diluted to a high concentration are alternately made to flow over the surface of the substrate together with the carrier gas, whereby a III-V compound is grown over the surface of the substrate (Inst. Phys. Conf. Ser. No. 79; Chapter 13, pp 737–738, 1985).

However, according to this method, the growth of a compound semiconductor is carried out by the thermal decomposition of the metallo-organic compound containing a Group III element and the hydride of a Group V element, so that it is impossible to lower the crystal growth temperature. In addition, the efficiency of raw materials or compounds to contribute to the growth of the compound semiconductor is low, and expensive and toxic gases must be used. Moreover, there arises the problem that impurities from the raw compounds are diffused into the grown crystal.

SUMMARY OF THE INVENTION

In view of the above, the primary purpose of the present invention is to provide a method for the epitaxial growth of semiconductors which can substantially overcome the problems encountered in the conventional method for forming thin III-V compound semiconductor films; that is, (1) the grown surface and the interface of the heterojunction have extremely small hills and valleys which are different in height by one or few atomic layers; (2) the epitaxial growth must be carried out at high temperatures; (3) it requires a long period of time to grow a desired crystal and (4) the impurity atoms tend to be trapped in the grown crystal. The present invention provides a method which can grow thin III-V compound semiconductor films at a higher rate, having high crystal qualities and having flat grown surfaces and flat interfaces of heterojunctions over a substrate maintained at low temperatures.

In order to achieve the above object, the first aspect of the present invention provides a method for forming a thin compound semiconductor film on the surface of a substrate by supplying at least one element of Group III and at least one element of Group V of the periodic table in the form of atoms and molecules to the surface of the substrate disposed in a vacuum chamber and heated, thereby forming a thin III-V compound semiconductor film. The method involves:

while normally supplying an element of Group V to the substrate in a quantity sufficient to prevent the evaporation of the element of Group V from a previously grown thin compound semiconductor film, at least at one stage of the growth of the thin compound semiconductor film, changing the supply of the element of Group V in a first small quantity which is not sufficient to combine with the element of Group III to produce a III-V compound, but sufficient to prevent the evaporation of the element of Group V from a previously grown thin compound semiconductor film and in a second quantity sufficient for reacting with the element of Group III, thereby producing a III-V compound; and interrupting the supply of the element of Group V in the second quantity when the element of Group III is supplied.

The second aspect of the present invention provides a method for forming a thin compound semiconductor film on the surface of a substrate by supplying at least one element of Group III and at least one element of Group V of the periodic table in the form of atoms and molecules to the surface of the substrate disposed in a vacuum chamber and heated, thereby forming a thin III-V compound semiconductor film, The method involves, while supplying the element of Group V in a first small quantity insufficient to react with the element of Group III on the substrate, but sufficient to prevent evaporation of the element of Group V from a previously grown thin compound semiconductor film, alternately supplying the element of Group III and the element of Group V in a second quantity sufficient to react with the element of Group III, thereby producing a III-V compound on the surface of the substrate.

Here, the quantity of the supply of at least one element of Group III in one time may be 90–110% of the quantity required for forming one atomic plane.

The first small quantity of the supply of the at least one element of Group V may be such that a partial pressure of the at least one element of Group V in the vacuum chamber is higher than the equilibrium dissociation vapor pressure of the element of Group V on the growing surface, but is less than 10 times the equilibrium dissociation vapor pressure. The second quantity of the at least one element of Group V may be greater than the number of atoms required for forming one atomic plane and may be less than five times the number of atoms.

Si may be supplied as a doping element to the surface of the substrate together with the at least one element of Group III.

The at least one element of Group V may be thermally cracked and then supplied to the surface of the substrate. A hydride of the at least one element of Group V may be thermally cracked so that the at least one element of Group V is supplied in the form of atoms.

Hydrogen may be supplied to the surface of the substrate immediately after the supply of the at least one element of Group III to the surface of the substrate. The hydrogen may be in the form of atoms. The quantity of the supply of the hydrogen may be 50–100 times as many as the number of atoms of one atomic plane of the at least one element of Group III. The quantity of the supply of the at least one element of Group III in one time may be 90–200% of the quantity required for forming one atomic plane The substrate may be maintained at a temperature between 100° and 700° C.

Here, the step for alternately supplying the at least one element of Group III and the at least one element of Group V in the second quantity to the surface of the substrate while the at least one element of Group V is normally supplied to the surface of the substrate in the first small quantity may be carried out succeeding to and or immediately before a step of normally supplying the at least one element of Group V in a quantity sufficient to combine with the at least one element of Group III, thereby producing a III-V compound and the at least one element of Group III.

The third aspect of the present invention provides a method for forming a thin compound semiconductor film on the surface of a substrate by supplying at least one element of Group III and at least one element of the Group V of the periodic table in the form of atoms and molecules to the surface of the substrate disposed in a vacuum chamber and heated, thereby forming a thin III-V compound semiconductor film, this method involves:

while normally supplying the at least one element of Group III to the surface of the substrate, supplying the at least one element of Group V to the surface of the substrate alternately in a first small quantity insufficient to react with the at least one element of Group III, therefore insufficient to produce a III-V compound, but sufficient to prevent the evaporation of the at least one element of Group V from a previously grown thin compound semiconductor film and in a second quantity sufficient to react with the at least one element of Group III thereby producing a III-V compound.

Here, the quantity of the supply of the at least one element of Group III in one time may be of the quantity required for forming one atomic plane.

The first small quantity of the supply of the at least one element of Group V may be such that a partial pressure of the at least one element of Group V in the vacuum chamber is higher than an equilibrium dissociation vapor pressure of the at least one element of Group V on the growing surface and is less than 10 times the equilibrium dissociation vapor pressure. The second quantity of the supply of the at least one element of Group V may be greater than the number of atoms required for forming one atomic surface and may be less than 5 times the number of atoms required for forming one atomic plane.

Si may be supplied as a doping element to the surface of the substrate together with the at least one element of Group III.

The at least one element of Group V may be thermally cracked and supplied to the surface of the substrate. A hydride of the at least one element of Group V may be thermally cracked so that the at least one element of Group V is supplied in the form of atoms.

The supply of the at least one element of Group III to the surface of the substrate may be interrupted and then hydrogen may be supplied to the surface of the substrate. The hydrogen may be in the form of atoms. The quantity of the supply of the hydrogen may be 50–100 times as many as the number of atoms of one atomic plane of the at least one element of Group III. The quantity of the supply of the at least one element of Group III may be 90–200% the quantity required for forming one atomic plane.

The substrate may be maintained at a temperature between 100° and 700° C.

The step of supplying the at least one element of Group V alternately in the first small quantity and the second quantity while normally supplying the at least one element of Group III to the surface of the substrate may be carried out immediately succeeding to and/or prior to the step of normally supplying the at least one element of Group V in a quantity sufficient to react with the at least one element of Group III, thereby producing a III-V compound and the at least one element of Group III.

BRIEF DESCRIPTION OF THE DRAWINGS

FIGS. 1A–1C are schematic views used to explain the growth of a crystal by a conventional MBE;

FIG. 2 shows the variation of the intensity of RHEED in the process of growing a GaAs crystal by the conventional method;

FIGS. 20A and 20B are time charts illustrating the timing of the supplies of Ga atoms and As molecules in a further embodiment of the present invention, respectively;

BEST MODES FOR CARRYING OUT THE INVENTION

Now, the present invention will be described in detail with reference to the accompanying drawings.

Figure 3A:
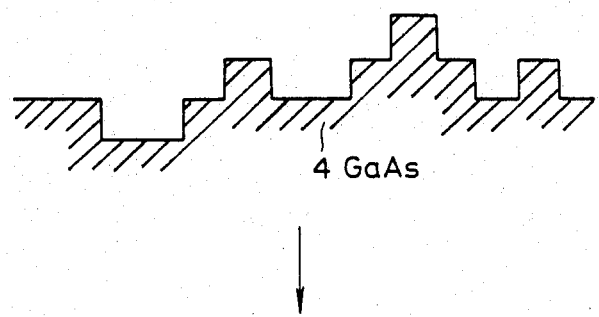
FIGS. 3A–3C are schematic views used to explain the process of flattening the interface of a heterojunction by the conventional method.
Figure 3B:
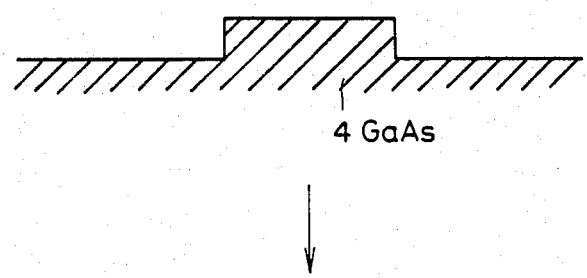
Figure 3C:
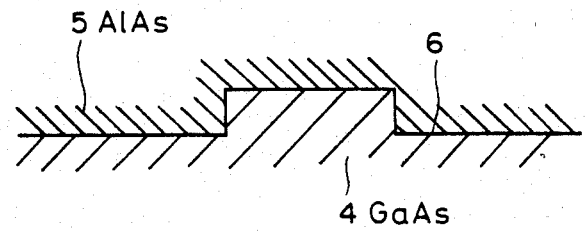
Figure 4:
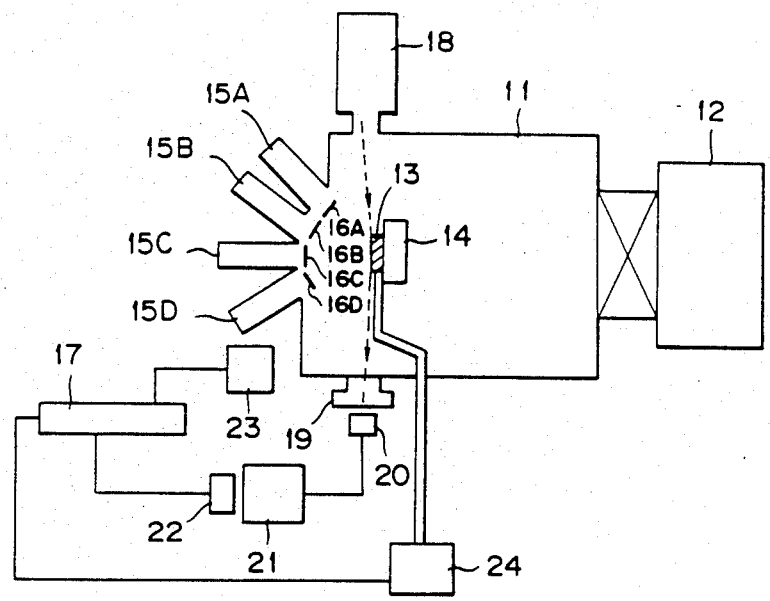
FIG. 4 is a schematic view of an apparatus adapted to carry out the present invention.

FIG. 4 is a schematic view of an apparatus adapted to carry out the present invention. Reference numeral 11 represents a vacuum chamber which is evacuated to a super high vacuum state of less than $10^{-10}$ Torr by a diffusion pump, a cryogenic pump, an ion pump or the like; 13, a substrate upon which is grown a thin compound semiconductor film; 14, a substrate holder incorporating therein a heater; 15–15D, molecular beam sources; and 16A–16D, shutters adapted to turn on or off the molecular beams and to control the magnitudes of the molecular beams. For the sake of simplicity, only four molecular beam sources 15A–15D are shown in FIG. 4, but the apparatus can be provided with eight molecular beam sources. Depending upon the kinds of thin compound semiconductor films to be grown, from the molecular beam sources the beams of elements of Group III and V are irradiated on the substrate. The quantity of each element supplied to or deposited on the substrate, the timing for opening or closing the shutters and the temperature of the substrate are all controlled by a controller 17 such as a microcomputer. During the growth of a compound semiconductor, the accelerated electron beam emitted from an electron gun 18 is made to irradiate at an angle of incidence of 2°–3° on the surface of the grown film and a reflection electron diffraction pattern is focused on a fluorecent screen 19, picked up by a television camera 20 and then displayed on a cathode-ray tube 21, whereby the ongoing growth of the material can be monitored. Furthermore, the intensity of light of the image displayed on the cathode-ray tube is detected by a photoelectric transducer 22 such as a solar cell and the output signal is applied to the controller 17 so as to analyze the data. Reference numeral 23 denotes a shutter controller which controls the opening or closing of the shutters in response to the control signal derived from the controller 17; and 24, a thermostat or a temperature controller for controlling the temperature of the heater incorporated in the substrate holder 14 as instructed by controller 17. The apparatus is further equipped with a mass spectrometer (not shown) which measures the mass of a material of a beam irradiated from each molecular beam source.

Figure 5A:
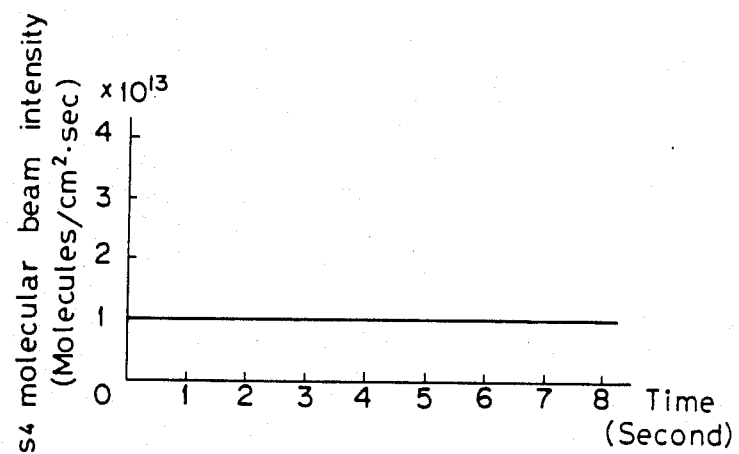
FIGS. 5A–5C are time charts illustrating timing of the supply of As molecules which is normally carried out and the timing of the supply of Ga atoms and As molecules which are alternately supplied in one embodiment of the present invention, respectively.
Figure 5B:
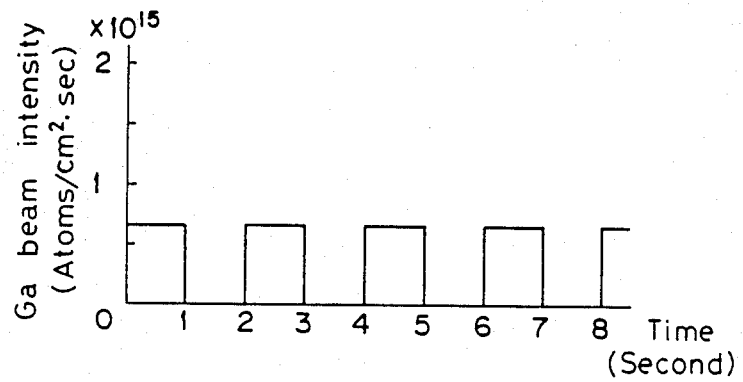
Figure 5C:
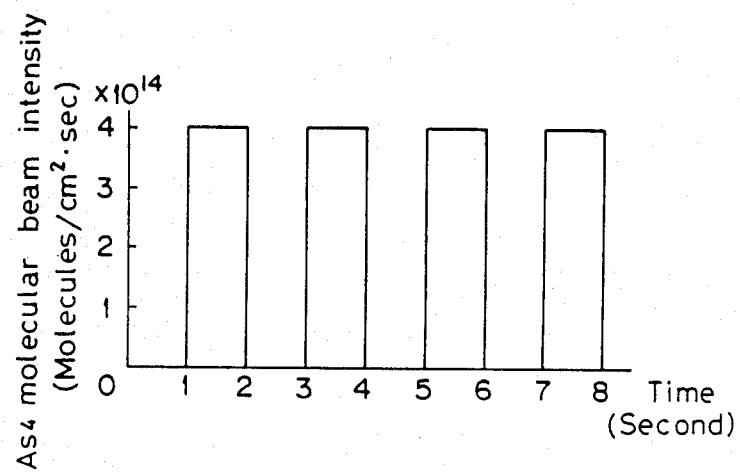

The apparatus described above with reference to FIG. 4 was used to grow a GaAs crystal over the (100) surface of a GaAs single crystal substrate. The super-high-vacuum chamber into which were disposed material elements and a substrate was evacuated at vacuum ranging from $10^{-6}$ to $10^{-11}$ Torr. The substrate was heated to 580°C. and metallic Ga and metallic As were heated to form the As and Ga beams which in turn were supplied to the substrate. The supply of each element was carried out according to the time charts as shown in FIGS. 5A–5C. More particularly, while the $As_4$ molecular beam was normally made to irradiate the surface of the substrate at a rate of about $1\times10^{13}$ atoms/cm$^2$·sec, the Ga atom beam of $6.4\times10^{14}$/cm$^2$·sec and the As molecular beam of $4\times10^{14}$ atoms/cm$^2$·sec were alternately irradiated for one second on the substrate. The quantity of the As molecular beam normally irradiated on the substrate is too small to react with Ga to form GaAs, but is sufficient to prevent the escape of As atoms from the growing crystal. Therefore, the quantity of the normally irradiated $As_4$ molecular beam must be higher than the equilibrium dissociation pressure of As in the growing surface and must be less than 10 times the equilibrium dissociation pressure. For instance, in the case of GaAs (at 600° C.), the quantity of the $As_4$ molecular beam must be from $0.5\times10^{13}$ atoms/cm$^2$·sec to $1\times10^{14}$ atoms/cm$^2$·sec. The quantity of Ga atoms supplied to the substrate shown in FIG. 5B is so selected that one atomic layer is formed by one irradiation of the Ga beam or is equal to the coordination number of the atoms on the growing surface. Furthermore, the quantity of the As atoms supplied to combine with Ga to form GaAs is about 4 times the quantity required for forming one atomic layer. Arsenic is irradiated on the substrate in the form of a molecule having four atoms. Therefore, the supply is expressed in terms on the number of As molecules. The quantity of supply of each element is the product of the intensity of the beam and the irradiation time and the beam intensity can be controlled by adjusting the heating temperature of the element source. The quantity of supply of Ga required for forming one atomic layer was determined by the period of oscillations of the intensity of RHEED during the conventional MBE process.

Figure 6:
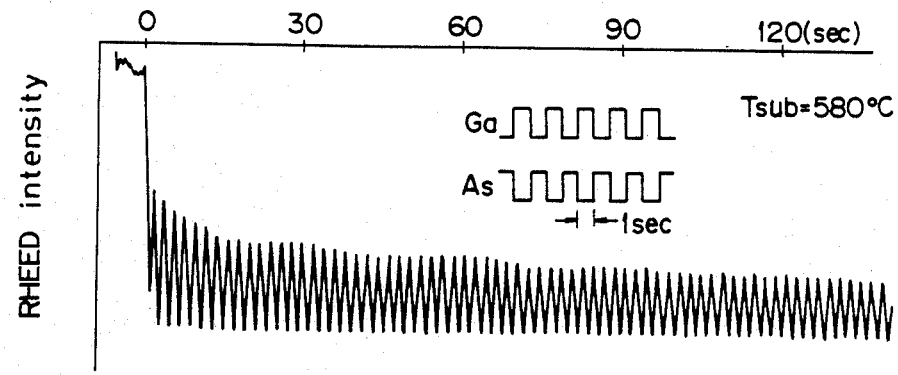
FIG. 6 shows the variation in intensity of RHEED when GaAs layers are grown in accordance with the present invention.

While the GaAs crystal was being grown in the manner described above, the electron beam accelerated to about 10 KeV was irradiated on the substrate to measure the intensity of RHEED. FIG. 6 shows the variation in time of the intensity of RHEED thus measured. As is seen from FIG. 6, the intensisty of RHEED decreases as soon as the supply of Ga is started and becomes minimum when a Ga layer is formed, but it increases as the supply of As is started and becomes maximum when an As layer is formed. That is, the intensity of RHEED oscillates in correspondence with the period of supply of the source elements. In this embodiment, unlike the variation obtained from the conventional process as shown in FIG. 2, the oscillations of the intensity of RHEED still continue without being damped even after several thousand layers have been formed. This means that the flatness of each atomic layer of the growing surface is not degraded at all during the growth of layers.

Figure 7A:
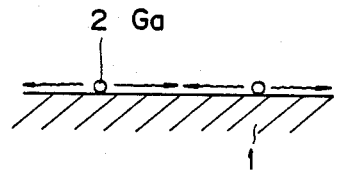
FIGS. 7A–7C are schematic views used to explain the formation of an atomic layer by the migration of Ga atoms in accordance with the present invention.
Figure 7B:
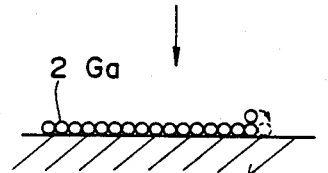
Figure 7C:
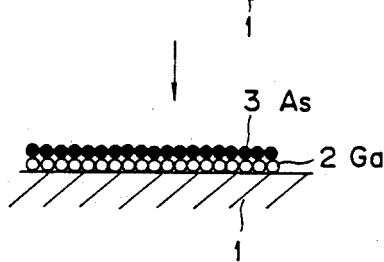

The same inventors found the fact that when only atoms of Group III of the periodic table instead of III-V molecules are supplied on the growing surface; that is, in the case of the growth of GaAs, when only Ga atoms are supplied, the mobility of Ga atoms on the surface is 100 times or more as high as the mobility of the GaAs molecules. Because of this phenomenon, the Ga atoms supplied to the growing surface form a flat atomic layer within an extremely short period of time. Atoms of Group V (As in the case of GaAs) are supplied after the supply of atoms of Group III has been completed and are adsorbed by the flat Group III atomic surface, whereby the III-V molecules are formed. The above-described process is completed within a very short period of time when the atoms of Group V are in the form of atoms or a simple molecule. The process for growing a flat atomic surface or plane is shown in FIGS. 7A–7C. Since the mobility of Ga atoms 2 is higher, when a predetermined quantity is supplied to the substrate 1 during the steps shown in FIGS. 7A and 7B, they rapidly cover the substrate. Furthermore, since the metallic bond in Ga-Ga is weaker than the bond in Ga-As, the Ga atoms on the Ga atoms are attracted by the As surface and completely cover the substrate, thereby forming the Ga atomic surface. Next, when the As atoms 3 are supplied in sufficient quantities to combine with Ga to form GaAs, a flat GaAs layer is grown as shown in FIG. 7C. In practice, these steps are periodically repeated to grow the layers. The surface mobility of the Ga atoms is very higher even at low temperatures, so that it is possible to grow a thin film at remarkably low temperatures.

It is considered that the fast migration of Ga, which is an element of Group III of the periodic table, is due to the fact that the Ga atoms supplied to the growing surface have a bond similar to the metallic bond. The migration of In and Al are also fast because their electronic state or configuration is similar to that of Ga. As a result, the growth of one atomic layer can be accomplished at a high rate.

In addition, according to the present invention, a very small quantity of an element such as As, which is an element of Group V, is normally supplied to the substrate so that the evaporation of the Group V element from the grown thin film can be prevented during the growth of a crystal. Therefore, a high quality thin film can be obtained As described above, the method in accordance with the present invention is considerably improved as compared with the prior art methods, and therefore a crystal in which the surface of each atomic layer is flat can be grown according to the present invention.

Figure 8A:
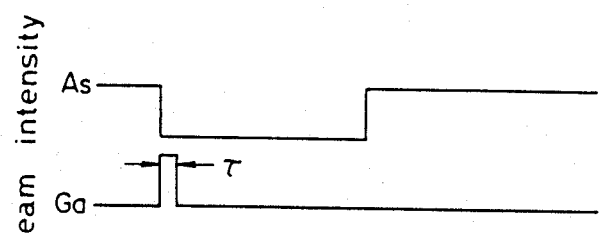
FIG. 8A is a time chart illustrating the timing of the supplies of Ga atoms and As molecules in another embodiment of the present invention.
Figure 8B:
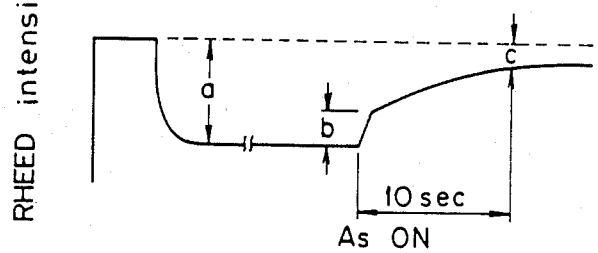
FIGS. 8B and 8C are diagrams illustrating the recovery of the intensity of RHEED in the process of crystal growth.
Figure 8C:
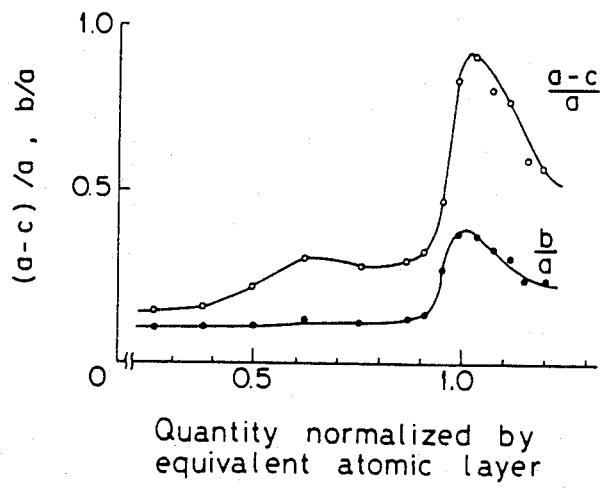

Then same inventors also made extensive studies and experiments in order to investigate the quantity of supply of Ga required for growing one atomic layer. That is, the amounts of Ga atoms supplied to the substrate were varied over a wide range while irradiating an extremely small quantity of As on the substrate, and after a predetermined time interval the supply of the As molecules for producing a compound was resumed. In the above-described process, the variations in the intensity of RHEED were measured. The results are shown in FIGS. 8A–8C. FIG. 8A shows the time charts of the As and Ga beam intensities in order to produce a compound and the supply of Ga was varied by changing the beam intensity or the beam irradiation time interval $\tau$. FIG. 8B shows the variations in the intensity of RHEED in response to the irradiation of the Ga and As beams. FIG. 8C shows the state of recovery of the intensity of RHEED in response to the quantity of the Ga atoms supplied. In FIG. 8C, the quantities of supply of the Ga atoms are normalized in such a way that the quantity of the Ga atoms required for growing one atomic layer is represented by unity (1). This quantity is $6.4 \times 10^{14}/cm^2$ when the Ga layer is grown on the (100) surface of the GaAs substrate. The recovery is expressed in terms of the ratio b/a, where "a" is the difference between the initial value of the intensity of RHEED and the intensity of RHEED when the Ga surface is grown and "b" is a value of rapid recovery immediately after the supply of As, and in terms of (a−c)/a which in turn represents a degree of recovery 10 seconds after the supply of As. In response to the supply of Ga, the reflectivity of the surface drops, so that the intensity of RHEED beam is rapidly degraded or decreased. When the supply of the As molecules is resumed after a predetermined time interval, the intensity of RHEED is recovered and it is seen that the recovery rate is greatly dependent upon the quantity of Ga supplied. When the quantity of Ga supplied is just sufficient to grow one atomic layer, the recovery rate becomes fastest. However, the range of the optimum quantity is not limited to an extremely narrow range and, as shown in FIG. 8C, when the quantity of Ga supplied is between 90 and 110% of the quantity required for growing one atomic layer, the recovery rate is high and there arises no problem in the formation of a compound. The above-described results were obtained when the substrate was maintained at 580° C., but a similar tendency was observed even when the temperature of the substrate was varied. When the quantity of Ga to be supplied is determined within the above-described range and when Ga and As are alternately supplied to the substrate, the amplitudes of oscillation of RHEED become extremely great and it was found that such oscillations continue as long as the growth of a thin film is continued. The quantity of Ga supply will be described in more detail below.

The time interval from the interruption of Ga supply to the start of As supply shown in FIG. 8A is completely independent of the formation of a compound and the flatness of the Ga surface. That is, even when this time interval is zero, the characteristics as shown in FIG. 8C remain unchanged. This means that the mobility of the Ga atoms is high.

As to the quantity of supply of As, when the quantity is one to 50 times the quantity required for growing one As atomic layer, the flat As surface can be formed. Since the vapor pressure of As is high, excess As atoms which do not contribute to the combination between Ga and As are vaporized out of the surface of the substrate therefore the flat As surface can be formed.

Figure 9:
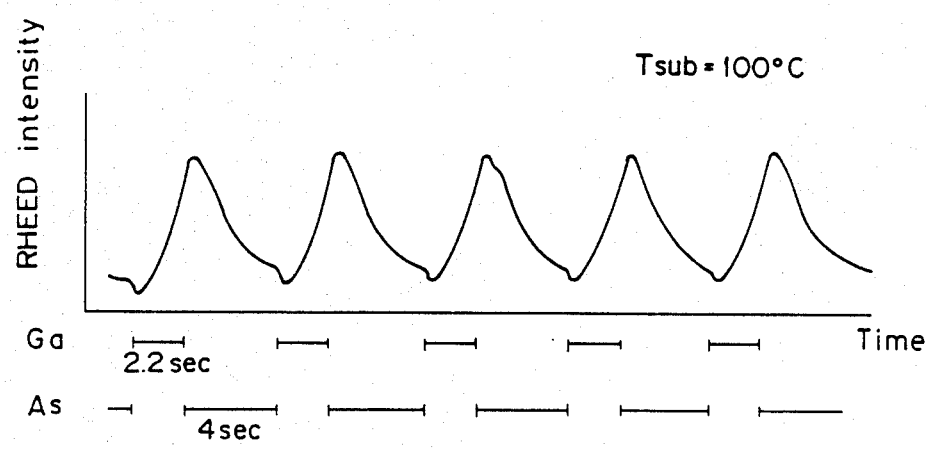
FIG. 9 is a diagram illustrating the intensity of RHEED of a GaAs layer grown over the surface of a substrate maintained at 100° C. in accordance with the present invention.

FIG. 9 shows the variations in the intensity of RHEED when the GaAs crystal was formed on the GaAs substrate maintained at 100° C. by normally irradiating the $As_4$ beam of $1 \times 10^{13}$ molecules/$cm^2$·sec and by alternately irradiating the Ga atomic beam of $3 \times 10^{14}$ atoms/$cm^2$·sec for 2.2 seconds and the $As_4$ molecular beam of $6 \times 10^{14}$/$cm^2$·sec for four seconds on the substrate. In this case, the intensity of RHEED becomes maximum when Ga is supplied, but becomes minimum when As is supplied. Therefore, the oscillations of the intensity of RHEED correspond to the source element supply period. These oscillations continued even after the growth of thousand periods (a few microns in thickness of a film). It is, therefore, considered that the flatness of the atomic surface can be maintained even through the temperature of the substrate is maintained at a surprisingly low temperature of 100° C. because only Ga atoms are supplied.

It is possible to grow $Al_xGa_{1-x}As$ by the process as shown in FIGS. 5A–5C. In this case, Al was supplied simultaneously with the supply of Ga. The Ga molecular beam cell and the Al molecular beam cell must be maintained at temperatures so that their beam ratio is maintained at a predetermined value x. When the temperature of the Ga molecular beam cell was 970° C. and the temperature of the Al molecular beam cell was 1030° C., the ratio x=0.35 was obtained. The shutter opening time interval for the Ga and Al molecular beam cells was so controlled that the total number of Al and Ga atoms become equal to the quantity just sufficient to grow one atomic layer. With the above-described cells, the opening time interval was 0.5 sec.

The step of doping impurities which is required for the fabrication of various PN junction devices was carried out in the manner described below. Beryllium as a p-type impurity and Si as an n-type impurity were supplied simultaneously with the supply of atoms of Group III. According to this doping step, the impurities are efficiently introduced at the lattice positions of the atoms of Group III and the doping was accomplished with a high degree of activation rate as compared with the conventional MBE method.

Figure 10:
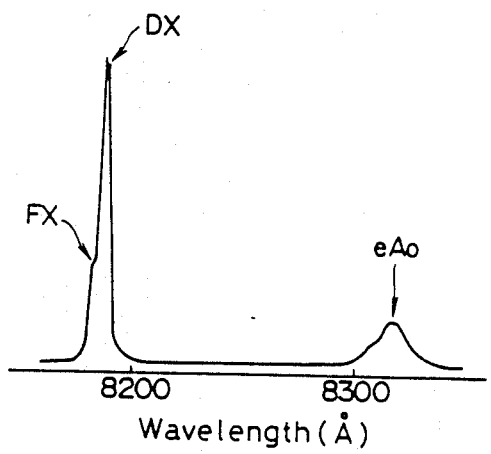
FIG. 10 is a photoluminescence spectral diagram at 4.2 K of a GaAs layer grown on the surface of a substrate maintained at 200° C.

FIG. 10 shows a photoluminescence spectrum at 4.2 K of a GaAs film consisting of 4000 atomic layers (1.1 μm in thickness) grown on the substrate maintained at 200° C. by the process as shown in FIGS. 5A to 5C. Because the exciton peaks (FX and DX) are sharply observed and because the intensity of the acceptor type light emission (eAo) is relatively low, it is expected that the quality and purity of the grown crystal are considerably enhanced.

Figure 11A:
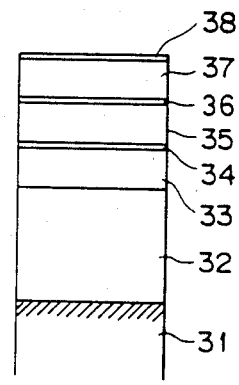
FIGS. 11A and 11B show a structure of an AlAs/GaAs quantum well grown over the surface of a substrate maintained at a temperature of 300° C. and a photoluminescence spectrum thereof at 4.2 K, respectively.
Figure 11B:
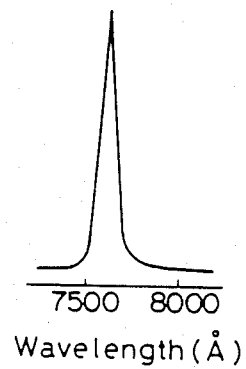

FIG. 11A shows a structure of an AlAs—GaAs quantum well grown on a substrate maintained at 300° C. by the process described above with reference to FIGS. 5A–5C. In FIG. 11A, reference numeral 31 represents a semiinsulating GaAs substrate; 32, a non-doped GaAs layer 500 nm in thickness; 33, 35 and 37, non-doped AlAs layers 50 nm in thickness; 34 and 36, quantum well layers each having a depth of 22 molecular layers; and 38, a GaAs cap layer. The AlAs layer can be grown by supplying Al instead of Ga described above. FIG. 11B shows a photoluminescence spectrum at 4.2 K of the quantum well structure. It is seen that even though the quantum well structure exhibits a wide photoluminescence spectrum but it can emit light almost as intense as that emitted by a quantum well structure grown at a high temperature.

Therefore, according to the present invention, it becomes possible to grow GaAs and AlAs crystals each having high optical qualities even at low temperatures.

Figure 12A:
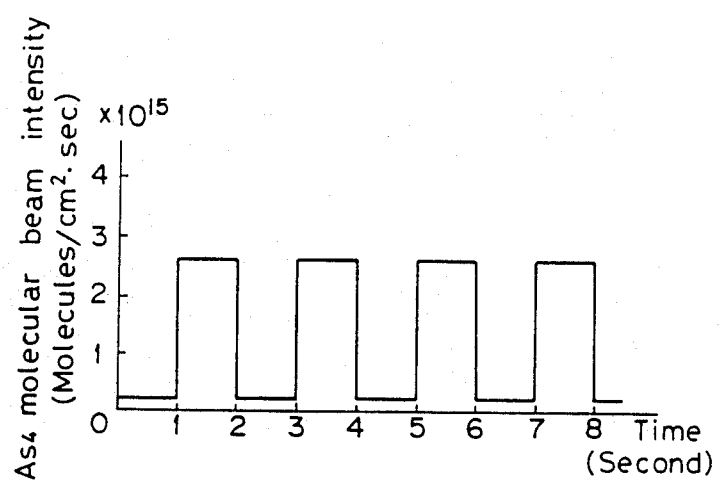
FIGS. 12A and 12B are time charts illustrating the timing of the supplies of As molecules and Ga atoms in a further embodiment of the present invention, respectively.
Figure 12B:
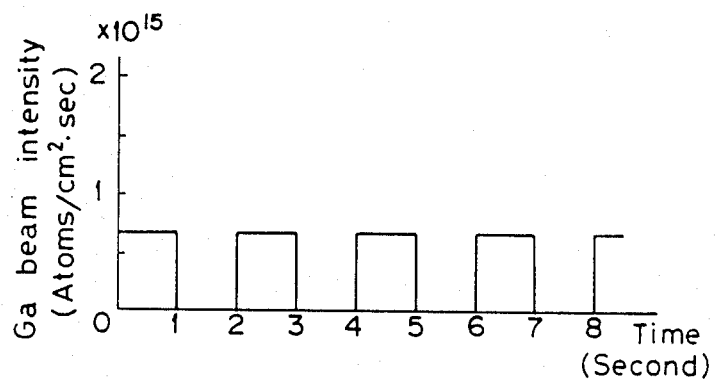

In the process described above with reference to FIGS. 5A–5C, two As supply sources are used, but as shown in FIGS. 12A and 12B, only one As source may be used in such a way that the As beam intensity is switched between a high intensity mode and a low intensity mode. Therefore, while a small quantity of As is normally irradiated on a substrate, the Ga and As beams are alternately irradiated thereon.

Figure 13:
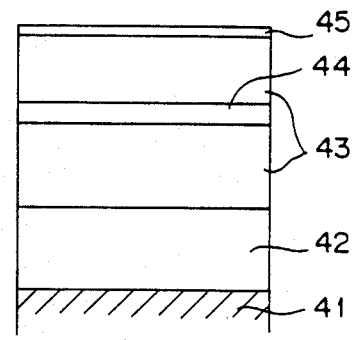
FIG. 13 is a view illustrating a quantum well structure.
Figure 14:
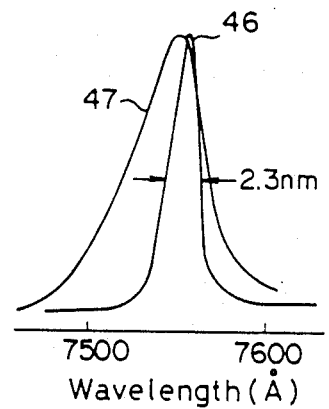
FIG. 14 shows the photoluminesence spectra of the quantum well structures, respectively, constructed by the present invention and by the prior art method.

The AlAs—GaAs single quantum well structures having the same construction were grown on the substrates maintained at 580° C. by the conventional MBE method in which Ga (or Al) and As are simultaneously supplied and by the method of the present invention in which while a small quantity of As is normally irradiated on the substrate, Ga (or Al) and As are alternately supplied thereto, and the photoluminescence spectra of these two structures were compared with each other. The structure is shown in FIG. 13. Both the quantum well structures were about 60Å in width (20 atomic layers). In FIG. 13, reference numeral 41 represents a GaAs substrate; 42, a GaAs buffer layer; 43, an AlAs barrier layer (600Å); 44, a GaAs quantum well (60Å) and 45, a GaAs cap layer (50Å). FIG. 14 shows the photoluminescence spectrum 46 of the quantum well structure grown in accordance with the present invention and the photoluminescence spectrum 47 of the quantum well structure grown by the conventional method. It is readily seen that the spectrum of the quantum well structure grown in accordance with the present invention is very narrow and is 23Å and that the hetero interface forming the quantum well is very flat.

As in the case of the GaAs crystal, a highly crystalline compound can be grown on a substrate maintained at a low temperature. The high-quality quantum well was grown on a substrate maintained at 200–300° C. by the combination of the AlAs-GaAs heterojunction. The intensive light emission at 7200Å corresponding to the quantum level jump was obtained from the single quantum well 30Å in width (that is, the width of GaAs), accordingly it is clear that AlAs has a sufficiently high degree of quality.

Next, the quantity of supply of an element of Group III such as Ga will be described and the novel phenomena discovered by the same inventors will be explained. The phenomena discovered by the same inventors are as follows:

(1) When the quantity of a Group V element on the growing surface is decreased, the diffusion of the material grown on the growing surface when a Group III element is supplied is remarkably accelerated. That is, in the case of the diffusion of metal atoms (the Group III element: Ga) alone on the growing surface, the bond between the metal atoms and the atoms of the surface of the grown layer is not a strong chemical bond and the metal atoms having an electron coordination similar to the metal bond are diffuse, consequently the diffusion rate is extremely fast. Therefore, the metal atoms (Ga) can move at high velocities over the growing surface having some little hills and valleys. This phenomenon is called the high speed migration phenomenon.

(2) Due to the above-described high speed migration phenomenon, the Group III metal atoms supplied in the succeeding period are so distributed to bury the small valleys on the scale of an atom selectively so that the growing surface becomes flat. That is, when the growing surface has the surface roughness on the scale of an atom, the edge portions of the top surfaces of the steps are unstable from the standpoint of energy while the edge portions of the lower surfaces are stable. Therefore, when a statistically large quantity of the Group III atoms migrate across the stepped portions with high speed, these atoms are trapped at the edge portions of the lower steps and the lower step edge portions are gradually displaced so that the lower steps or the whole small valleys are buried. This phenomenon is called the selfflattening phenomenon.

Both of the above-described phenomena are extremely ideal factors in obtaining the flat atomic surface or heterojunction interface. By utilizing the above-described phenomena, it becomes possible to grow a compound semiconductor having a flat grown surface or a heterojunction interface on a substrate maintained at relatively low temperatures by controlling the supplies to the substrate of a Group III element and a Group V element.

According to the present invention, not only the surface of the crystal grown on the flat substrate can be made flat on the scale of an atom, but also even when the underlying layer has small hills and valleys on the scale of an atom, when metal atoms of Group III are supplied while atoms of Group V are supplied in a very small quantity, these metal atoms are so distributed to bury small valleys, thereby flattening the surface. When the above-described phenomena are utilized, the quantity of supply of atoms of Group III during each period as shown in FIGS. 5B and 12B is not needed to be strictly controlled. In addition, while atoms of Group III are normally supplied to the substrate, the quantity of supply of a Group V element is varied to a sufficient low quantity as compared with the quantity required for periodically or continuously growing the crystal. Thus, the surface of the grown layer can be maintained flat.

Figure 15A:
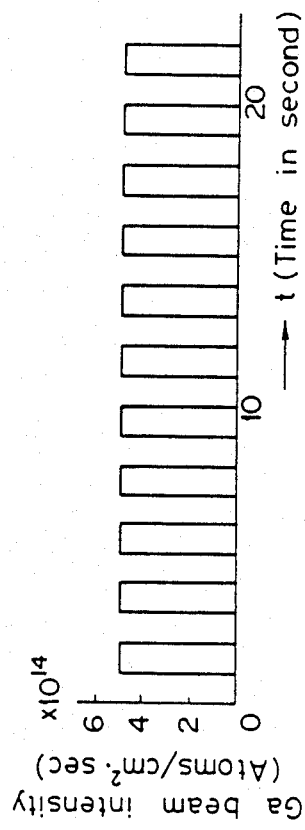
FIGS. 15A and 15B are time charts illustrating the timing of the supplies of Ga atoms and As molecules to a substrate in a yet further embodiment of the present invention, respectively.
Figure 15B:
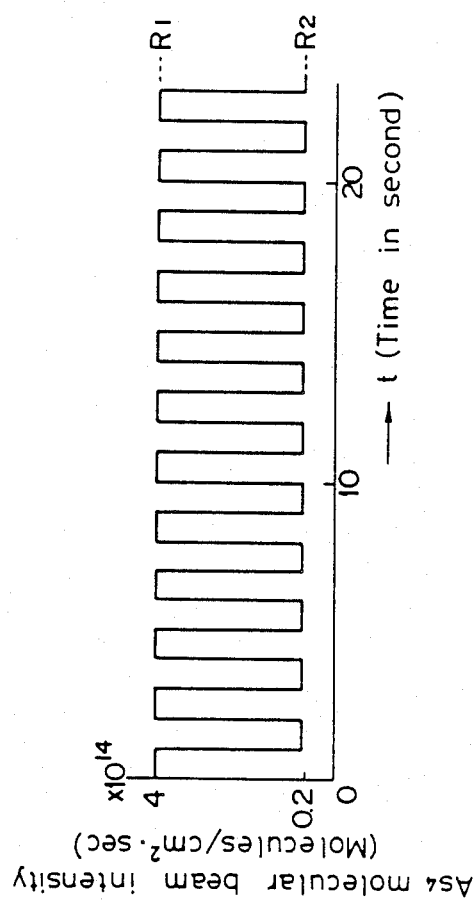
Figure 16:
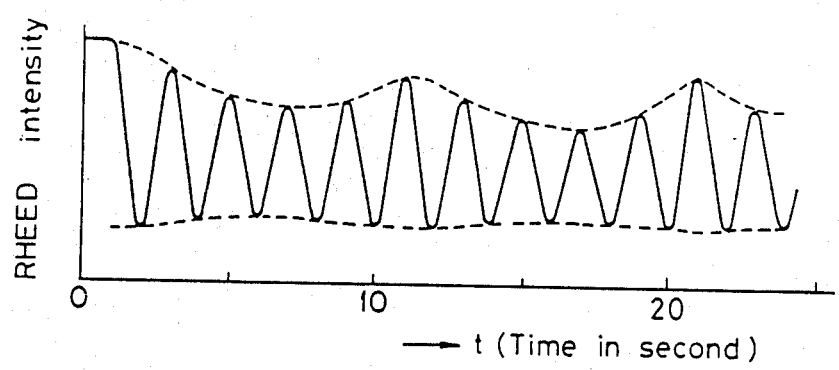
FIG. 16 shows the variation in intensity of RHEED of a thin film grown in accordance with the time charts shown in FIGS. 15A and 15B.

Next referring to FIGS. 15A, 15B and 16, the experimental results of the above-described self-flattening phenomenon will be described. In the experiments, the apparatus as shown in FIG. 4 was used and Ga was selected as a Group III element while As was selected as a Group V element. The crystal was grown on the (100) crystal face of the GaAs single crystal substrate maintained at 580° C. FIGS. 15A and 15B show the variations in time of the quantities of Ga and As supplied to the substrate. Ingots were heated and evaporated to supply Ga and As, respectively. In the experiments, the quantity of Ga supply at one second interval was 80% of the coordination number ($6.4 \times 10^{14}$/cm$^2$) of the (100) face of the GaAs substrate. The supply of As is alternately switched in a large quantity $R_1$ and a small quantity R. $R_1 >> R_2$ and in this case the quantity $R_2$ is about 5% of the large quantity $R_1$ so that these quantities are not sufficient to continue the growth of GaAs at the above-described growing temperature. FIG. 16 shows the variations in time of the intensity of the beam of RHEED reflected from a mirror surface (to be referred to the intensity of RHEED) during the growth of GaAs under the above-described conditions. The intensity of RHEED oscillates as it decreases in response to the supply of Ga and increases in response to the supply of As. FIG. 16 shows a feature that a beat occurs at about every five periods. When the peak of the beat is considered to be a time point at which the maximum flatness is recovered, this result shows that the flat surface appears at every five periods.

Figure 17:
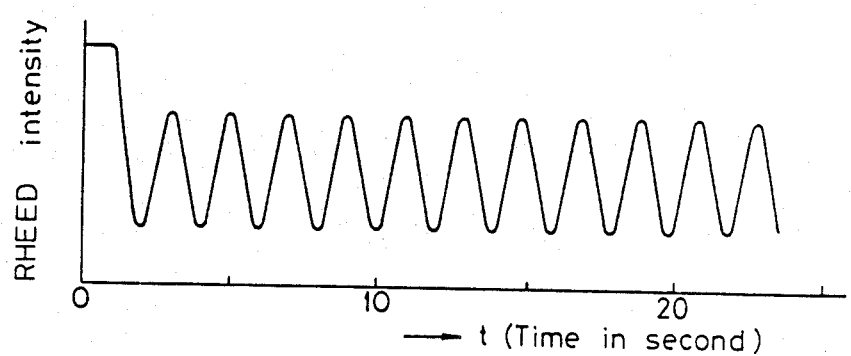
FIG. 17 shows the variation in time of the intensity of RHEED when the quantity of Ga atoms supplied is made equal to the coordination number of the surface being grown.

When the quantity of supply of Ga for one period is selected to be equal to the coordination number of the surface of the grown layer; that is, the quantity required for forming one atomic layer ($6.4 \times 10^{14}/cm^2$) the oscillations of the intensity of RHEED continues permanently as long as the growth continues as shown in FIG. 17, but in this case no beat is observed. When the quantity of supply of Ga for one period is selected to be 0.9 of the coordination number of the surface of the grown layer, a beat appears at every 10 periods and when the quantity of supply of Ga is selected at one third ($\frac{1}{3}$) of the coordination number, a beat is observed at every three periods. Such phenomena can be explained only when it is considered that the Ga atoms are selectively distributed to the small valleys of the surface of the grown layer during the growth of the thin film. Furthermore, a flat grown surface can be formed on a substrate having surface roughness.

Figures 18A, 18B, 18C, 18D, 18E, 19A, 19B, 19C, 19D, 19E:
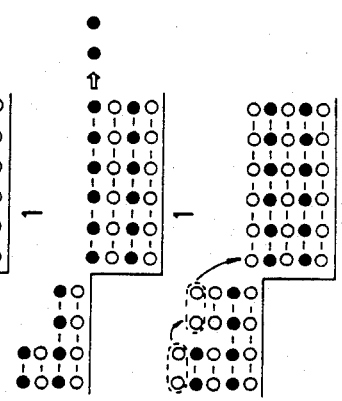
FIGS. 18A–18E and FIGS. 19A–19E are schematic views used to explain the self-flattening phenomenon attained by the present invention.

Referring next to FIGS. 18A-18E, the self-flattening mechanism in a thin film grown on a flat substrate 1 will be explained. The Ga and As atoms are supplied in the manner described above with reference to FIGS. 15a and 15B. When the Ga atoms are supplied in quantity of 80% of the coordination number of the surface (FIG. 18A) of As atoms deposited on the substrate, a step equivalent to one atom results. The surface covered by the Ga atoms is 80% (FIG. 18B). When the As atoms are supplied, they combine only with the Ga atoms and do not combine with the As atoms in the lower layer, so that a step equivalent to one GaAs molecule appears (FIG. 18C). When the Ga atoms are supplied in quantity equal to 80% of the coordination number, some of the newly supplied Ga atoms combine with 20% of the As atoms remaining in the lower layer but do not combine with the As atoms at the step of the upper layer as shown in FIG. 18D. As a result, the area of the upper layer occupied by the Ga atoms becomes 60% of the surface of the grown layer. When the As atoms are further supplied, they combine only with the Ga atoms so that the grown surface in the form of a step whose upper layer occupies 60% and whose lower layer occupies 40% is formed In like manner, every time when the Ga and As atoms are supplied for one period, the lower layer of the step is increased while the upper layer thereof is decreased. Therefore, a flat surface is repeatedly formed at every five periods. This is the cause for producing beats in the oscillations of the intensity of RHEED shown in FIG. 16. In the respective growth steps shown in FIGS. 18A-18E, a very small quantity of the As atoms is supplied during each period when the Ga atoms are supplied, therefore the escape of the As atoms from the surface of the grown layer can be prevented and there is almost no chance that the simultaneously supplied As and Ga atoms combine with each other. The quantity of supply of the As atoms during the period when the As atoms are supplied is greater than the quantity of the Ga atoms exposed at the surface of the grown layer, but an excess of the As atoms is discharged out of the surface of the grown layer.

Referring next to FIGS. 19A-19E, the self-flattening mechanism in the case of the growth on a substrate 1 with a step will be described. It is assumed that the height of the step is equal to four atomic layers (two GaAs molecular layers) and that Ga and As are supplied in the manner described above with reference to FIGS. 15A and 15B.

As shown in FIG. 19A, the As surface is formed over the surface of the grown layer. When the Ga atoms are supplied in quantity equal to 80% of the coordination number as shown in FIG. 19B, they readily combine with the As atoms of the layer over the lower surface of the step and do not combine with the As atoms in the layer over the upper surface of the step. As a result, as shown in FIG. 19C, when the Ga and As atoms are supplied for two periods, the initial step of the substrate disappears. As shown in FIG. 19D, the Ga atoms supplied during the third period combine with the As atoms in the lower layer of the As atoms exposed at the surface and when the As atoms are supplied again, the height of the step becomes equal to one molecular layer (FIG. 18E). Thereafter, the surface of the grown layer is flattened in a manner substantially similar to that described above with reference to FIGS. 18A-18E.

The above-described self-flattening phenomenon is mainly due to the behavior of the Ga atoms during the periods when the Ga atoms are supplied. Therefore, it becomes possible to attain the self-flattening of the surface of the grown layer by the combination of the conventional MBE technique in which the Ga atoms and the As atoms sufficient in quantity to combine with the Ga atoms to form GaAs are simultaneously supplied, thereby forming a compound semiconductor layer with the method in accordance with the present invention in which a very small quantity of the As atoms is supplied during the Ga atom supply period. In other words, during the conventional molecular-beam beam epitaxial growth, the quantity of supply of a Group V element is decreased temporarily while a Group III element is normally supplied so that a flat grown surface can be obtained. Then, a flat grown surface and a flat hetero interface can be formed at low temperatures. In addition, as compared with the Ga supply method described above with reference to FIG. 15A, the switching of a Group III element can be eliminated, so that the growth control can be simplified and a high growth rate can be obtained.

The selt-flattening phenomenon can be observed not only in the case of the deposition of the Ga atoms but also almost all the cases of metal atoms of Group III. In order to attain the self-flattening phenomenon, it is preferable that the quantity of metal atoms of Group III will not excessively become higher than the coordination number of the surface of the grown surface and it is more preferable that the quantity is equal to or less than the coordination number.

Figure 21:
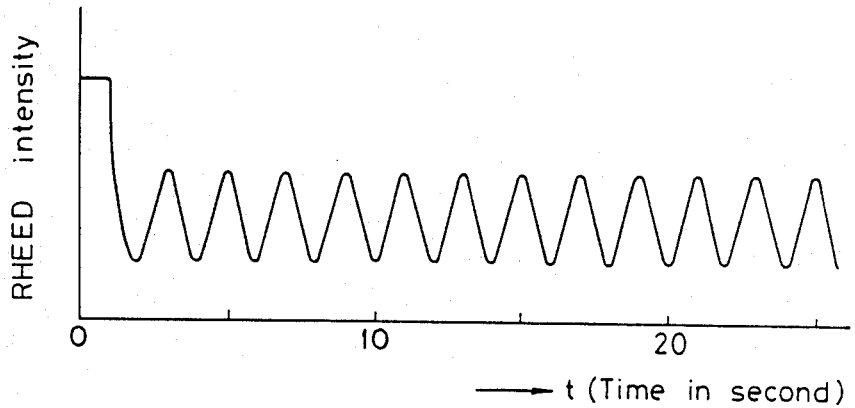
FIG. 21 shows the variation in time of the intensity of RHEED of a GaAs layer grown by the method of the present invention.

FIGS. 20A and 20B show the variations in time of the supplies of the Ga atoms and the As molecules, respectively, in one embodiment of the present invention. FIG. 20A shows the supply of Ga which is continued at a predetermined quantity as in the case of the conventional MBE method. FIG. 20B shows the supply of As which is switched between a large quantity $R_1$ and a small quantity $R_2$ equal to those described above with reference to FIG. 15B. The quantities $R_1$ and $R_2$ are also equal to those described above with reference to FIG. 15B. When the time interval for $R_1$ is represented by $\tau_1$ while the time interval for $R_2$ is represented by $\tau_2$, $\tau_1$ is substantially equal to that in the case of the conventional MBE method and the small hills and valleys on a scale of an atom appear over the surface of the grown layer. However, the Ga atoms which are supplied to the succeeding $\tau_2$ period (the period for supplying the As atoms in a small quantity $R_2$) bury the small valleys, so that a flat surface is reproduced and the continuous oscillations of the intensity of RHEED are observed. FIG. 21 shows the mode of oscillations of the intensity of RHEED when the number of the Ga atoms supplied at the period $\tau_1$ is equal to the number required for forming one atomic layer. FIG. 21 shows that even when the quantity of supply is varied a little, the continuous oscillations can be observed, so that the grown surface is smoothly flattened. Such continuous oscillations can be observed even when the temperature of the substrate is lowered as low as 200° C.

Figure 22A:
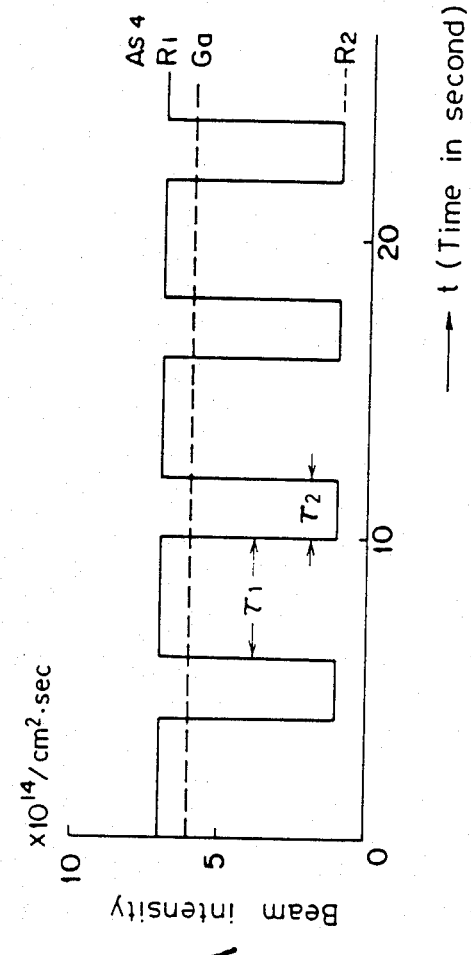
FIGS. 22A and 22B show the time charts illustrating the timing of the supplies of Ga atoms and As molecules and the variation in time of the intensity of RHEED in a further embodiment of the present invention.
Figure 22B:
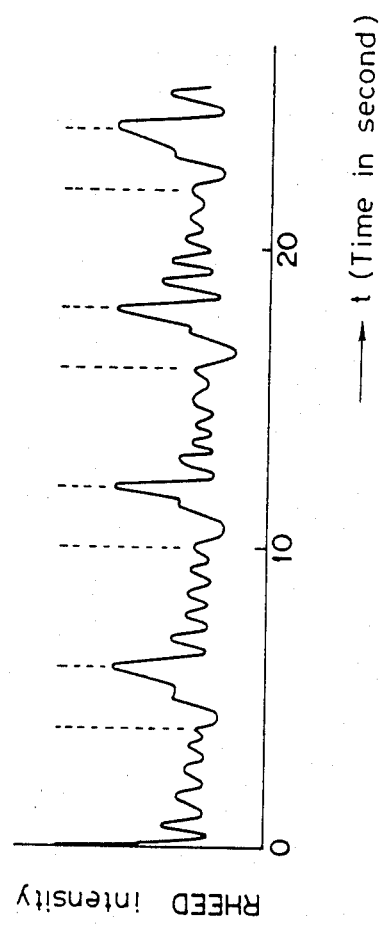

The difference in height between the small hills and valleys on growing surface by ordinary MBE method is of the order of five atomic layers at most, accordingly this method is used immediately before the formation of a desired flat surface such as a hetero interface, the object of attaining a flat surface can be attained. That is, the difference in height between the small hills and valleys of the order of five atomic layers can be completely eliminated by repeating the process described above with reference to FIGS. 20A and 20B for a few periods and the grown surface is completely flattened. In order to confirm the above-described self-flattening phenomenon, the number of the Ga atoms supplied during one period $\tau_1$ was increased up to the number sufficient to form five atomic layers in the experiments. FIGS. 22A and 22B show the variations in time of the supplies of the Ga atoms and the As molecules and the resulting variations in time of the intensity of RHEED, respectively. Even in this case, it is apparent that the surface flattening is accelerated during the period $\tau_2$.

Figures 23A, 23B:
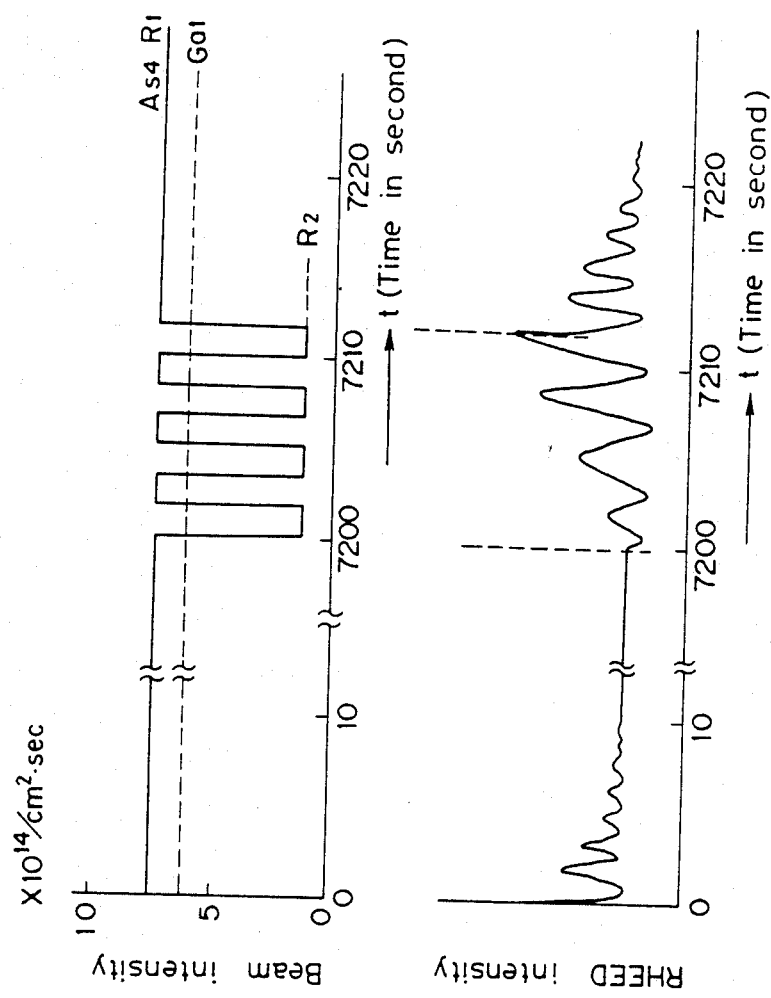
FIGS. 23A and 23B show the time charts illustrating the timing of the supplies of Ga atoms and As molecules and the variation in time of the intensity of RHEED in a yet further embodiment of the present invention, respcetively.

The above-described process was used after the growth for a long period of time by the conventional molecular-beam epitaxial technique. FIG. 23A shows the Ga and As supply programs while FIG. 23B shows the variations in time of the intensity of RHEED corresponding to the Ga and As supply program. After the GaAs layer 2 μm in thickness has been grown over the substrate maintained at 580° C. by conventional MBE metnod, when the process in accordance with the present invention is repeated for a few period, it is apparent that tne amplitudes of oscillations which once disappeared reappear and the flatness is recovered.

Figure 24:
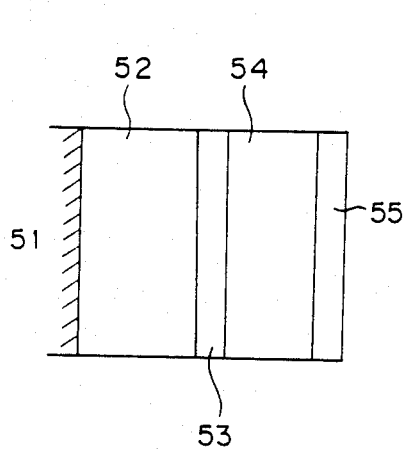
FIG. 24 shows the structure of the quantum well laser fabricated in accordance with the present invention.

Next, some applications of the method in accordance with the present invention to the fabrication of various devices will be described. FIG. 24 shows a single quantum well semiconductor laser having an active layer 10 nm in thickness. In the case of the fabrication of this laser, the supply programs as shown in FIGS. 20A and 20B were used in such a way that the quantity of the Ga atoms supplied during the period $\tau_1$ became equal to the quantity required for forming a single atomic layer and $\tau_2=\tau_1$. The substrate was maintained at 580° C. FIG. 24 shows the structure of the laser thus fabricated. Reference numeral 51 represents an n-GaAs substrate; 52, an n-AlGaAs layer 1,000 nm in thickness; 53, a GaAs quantum well 10 nm in thickness; 54, a p-AlGaAs layer 1,000 nm in thickness and 55, a p-PaAs layer 500 nm in thickness.

The AlGaAs layer can be grown by simultaneously supplying the Al atoms and Ga atoms in the same quantity to the substrate. The threshold current of the laser diode thus fabricated was as low as about 50% as compared with that of the laser diodes fabricated by the conventional MBE method.

Figures 25A, 25B:
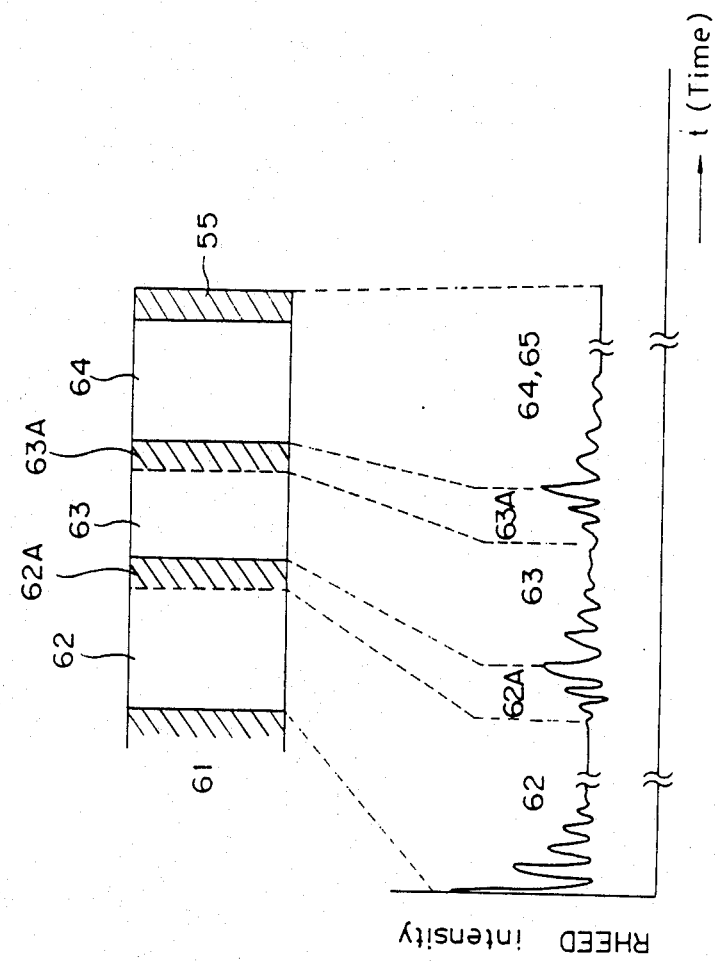
FIGS. 25A and 25B show the structure of another quantum well constructed in accordance with the present invention and the variation in time of the intensity of RHEED of each grown layer, respectively.

FIGS. 25A and 25B show one example of the laser diode substantially similer in construction to that described above with reference to FIG. 24. To fabricate this laser diode the process in accordance with the present invention described in detail with reference to FIGS. 20A and 20B were applied only immediately before the formation of heterojunction interfaces. FIG. 25A shows the structure of the laser diode and FIG. 25B shows the variations in time of the intensity of RHEED corresponding to the growth of respective layers. The structure of the laser diode in accordance with this embodiment is substantially similar to that of the laser diode shown in FIG. 24. The growing temperature was also the same and was 580° C. An n-AlGaAs layer 62 was grown over the surface of an n-GaAs substrate 61 by the conventional MBE method and its last portion 1 nm in thickness (indicated by 62A in FIGS. 25A and 25B) was grown by the process described above with reference to FIGS. 20A and 20B (in which Ga and Al were supplied in the same quantity). Thereafter, a quantum well layer 63 with a thickness of 10 nm was grown by the conventional MBE method and its last portion 1 nm in thickness (indicated by 63A in FIGS. 25A and 25B) was grown by the process described above with reference to FIGS. 20A and 20B. Next, an Si-doped p-AlGaAs layer 64 and then an Si-doped p-GaAs cap layer 65 were grown by the conventionai method The variations in time of the intensity of RHEED during the growth of respective layers are indicated by same reference numbers and it is seen that when the present invention is applied, the oscillations are recoverec; that is, the flatness is recovered.

Figures 26A, 26B:
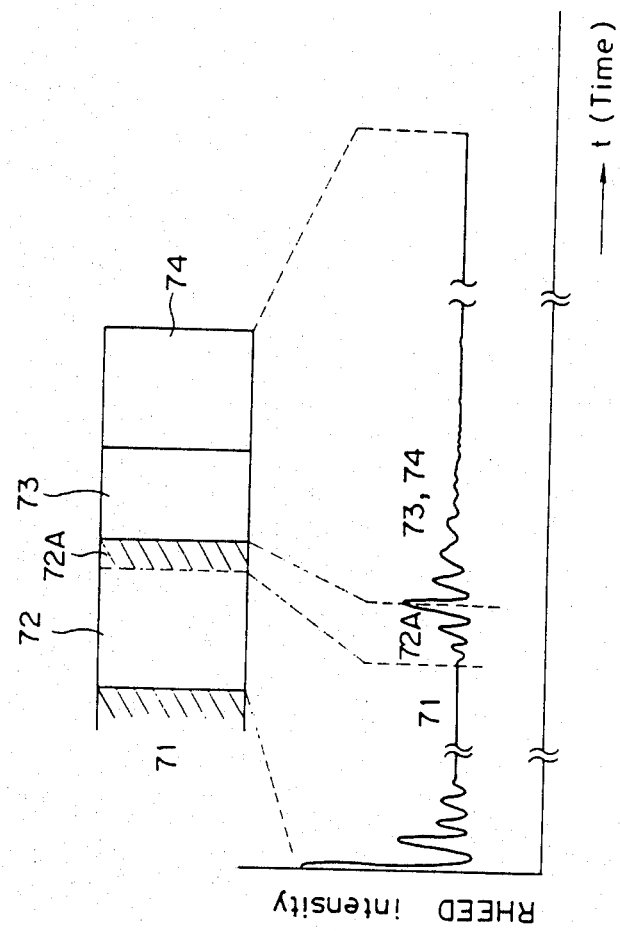
FIGS. 26A and 26B show a two-dimensional electronic structure device fabricated in accordance with the present invention and the variation in time of the intensity of RHEED of each grown layer, respectively.

FIG. 26A shows a two-dimensional electronic device fabricated by the process substantially similar to that described above and FIG. 26B shows the variations in time of the intensity of RHEED corresponding to the growth of respective layers. In FIG. 26A, reference numeral 71 represents a semi-insulating GaAs substrate; 72, a non-doped GaAs layer 1 μm in thickness grown by the conventional MBE method; 72A, a non-doped GaAs layer 1 nm in thickness grown by the process in accordance with the present invention described above with reference to FIGS. 20A and 20B; 73, a non-doped AlGaAs layer 10 nm in thickness; and 74, a Si-doped p-AlGaAs layer 50 nm in thickness. The two AlGaAs layers 72 and 73 were grown by the conventional MBE method. Si can be supplied during the growth of the AlGaAs layer so as to be doped therein. From the variation of RHEED intensity during growth, it is seen that the flatness is recovered at the heterojunction interfaces. With this structure, a high degree of mobility ($2\times10^5$ cm$^2$/V·sec at 4.5K in the case of the electron density of $1\times10^{12}$/cm$^2$) can be obtained at an especially high two-dimensional electron density. These results are considered to be attained due to the improvement of the surface flatness of the heterojunction interface.

According to the present invention, it becomes possible to grow high-quality AlAs and GaAs layers at any temperature in excess of 100° C. Furthermore, in the cases of the processes described above with reference to FIGS. 20A, 20B and 23A, it is not needed to switch the supply of atoms of Group III and the growth rate at low temperatures can be improved from 0.25 μm/h to 1 μm/h as compared with the embodiment described above with reference to FIGS. 5A–5C.

In the above-described embodiments, the grown surface was flattened by the material supply process described above with reference to FIGS. 20A and 20B immediately before the formation of a hetero interface, but it is, of course, possible to attain similar effects when the process described above with reference to FIGS. 5A-5C in which the supply of Ga is switched or the material supply process described above with reference to FIGS. 12A and 12B is applied immediately before the formation of a hetero interface.

So far the Group V element has been described as the As4 molecule having four atoms. It is possible to grow a thin III-V compound film at a high growth rate and at lower temperatures by cracking the molecules of Group V which are to be supplied to the substrate, into molecules having a fewer number of atoms or into atoms.

The process for growing a thin GaAs film over a GaAs substrate will be described. Of the molecular beam sources in the apparatus shown in FIG. 4, the As molecular beam source is provided with a cracker cell.

Figure 27:
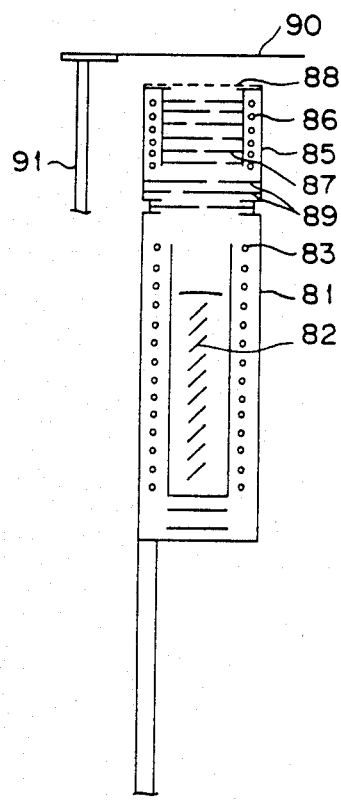
FIG. 27 is a schematic sectional view of a cracker cell.

FIG. 27 is a sectional view of a cracker cell. In FIG. 27, reference numeral 81 represents a cell main body incorporating therein metallic arsenic 82. Reference numeral 83 denotes a heater incorporated in the cell As4 molecules each having four atoms are heated and evaporated by the heater 83 and flow into a cracking portion 85 where As4 molecules are heated to a high temperature. Reference numeral 87 denotes metal plates having a high melting point and made of, for instance, tantalum and the heated As4 vapor impinges on them. In addition to the thermal dissociation at a high temperature, the dissociation from As4→As2 is accelerated because of the impingement. Reference numeral 88 is a diffuser such as a mesh which causes As2 molecules each having two atoms to uniformly irradiate the substrate. Reference numeral 89 is a heat insulating filter for thermally isolating the cell main body from the cracking portion; 90, a shutter; and 91, a shaft for opening or closing the shutter. The number of atoms which constitutes an As molecule can be measured by the mass spectrometer mounted on the apparatus shown in FIG. 4.

Two cracker cells are prepared. The shutter of one of the two cracker cells is kept open and the temperature of the cell is maintained at a relatively low temperature so that a relatively low intensity beam is made to irradiate the substrate. The other cell is maintained at a relatively high temperature and its shutter 90 is opened and closed so that pulse-like high-density beams are directed to the substrate. In this manner, the irradiation of As as shown in FIGS. 5A-5C can be carried out.

Figure 28:
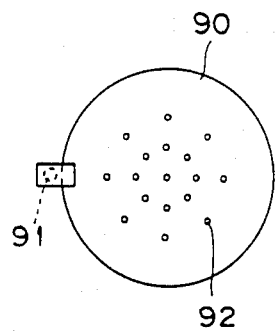
FIG. 28 is a top view of a shutter.

As shown in FIG. 28, a plurality of holes 92 are formed through the shutter 90 so that when the shutter 90 is opened, the beam intensity is increased but when the shutter 90 is closed the beam intensity is decreased. In this case, the intensity of the As beam from a single As source can be varied so that the quantity of As to be supplied to the substrate can be varied.

A thin GaAs film was grown on the (100) crystal face of a single GaAs crystal maintained at 200° C. The Ga source was maintained at 970° C. and one Ga beam irradiation time was one second. In this case, the beam intensity is about $6.4 \times 10^{14}$ atoms/cm$^2$·sec The partial pressure of As was maintained at $1 \times 10^7$ Torr ($\phi_0$) during the Ga beam irradiation period and Ga and As were alternately maintained at the partial pressure of $1 \times 10-6$ Torr ($\phi_1$) for two seconds. Arsenic was cracked at 1000° C. Prior to film growth, the substrate was heated to about 580°-600° C. and the As beam was made to irradiate the substrate to remove an oxide film on the substrate and then the temperature of the substrate was lowered to a predetermined temperature to start the growth.

Figure 29:
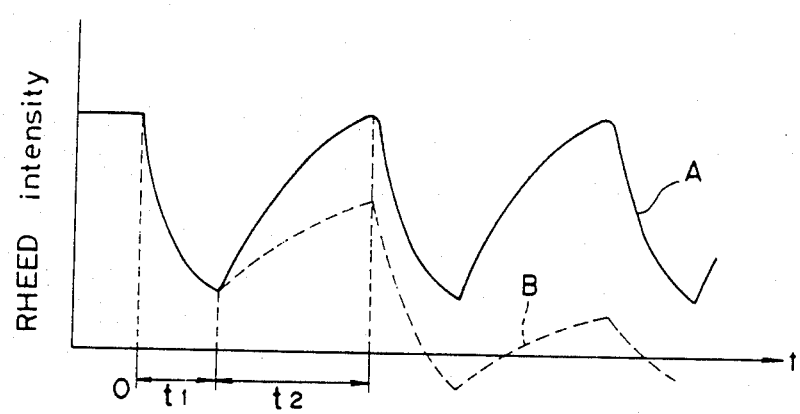
FIG. 29 shows the variation in time of the intensity of RHEED of a grown GaAs crystal.

The curve A shown in FIG. 29 indicates the variations of the intensity of RHEED during the growth of the thin GaAs film carried out in the manner described above. The shutter of the Ga cell is opened at t=0 and then the intensity of RHEED is decreased. When one atomic layer is grown after $t_1$, the Ga shutter is closed while the As beam intensity is increased from $\phi_0$ to $\phi_1$ then the intensity of RHEED is recovered and increased to the initial value after $t_2$. It is considered that, reflectivity of the electron beam at the Ga surface is low, so that in the case of the supply of Ga the intensity of RHEED is decreased, but when As is supplied, the flat GaAs surface is formed, so that the intensity of RHEED is increased.

The curve B shown in FIG. 29 shows the variations of the intensity of RHEED under the same conditions described above except that cracking of As is not carried out. When no cracking is carried out and when the As4 molecules each having four atoms are used, the recovery of the intensity of RHEED takes a long time, therefore after a predetermined time interval $t_2$, the intensity of RHEED is not completely recovered yet as indicated by the curve B. The reason is that since the substrate is maintained at a low temperature, the cracking process of As4→As2→As is not satisfactorily carried out and the absorption of As on the Ga surface takes a long period of time.

The higher the cracking temperature, the better, and the cracking of the As4 molecules can be carried out satisfactorily at a temperature in excess of 900° C. Furthermore, instead of metallic As, a hydride of As such as AsH3 may be introduced into the apparatus through the supply line which is heated so that the atoms resulting from the cracking of AsH3 may be supplied to the substrate. In the latter case, the oscillations of the intensity of RHEED will not be damped as in the case of the curve A in FIG. 29.

In the above-described embodiments, the substrates were maintained at 200° C., but according to the method of the present invention, it becomes possible to grow a high-quality crystal on a substrate maintained at a temperature lower than 400° C. or at the lowest temperature of 100° C., at a high growth rate while according to the conventional method the substrate must be maintained at about 600° C.

The cracking process of a Group V element can be applied to the supply processes described above with reference to FIGS. 20A, 20B and 23A.

So far the present invention has been described in conjunction with GaAs, but a Group V element to be cracked is not limited to As and a Group III element is not limited to Ga. It is apparent that the present invention can be equally applied to other III-V compound semiconductors.

According to this method, the molecules of a Group V element are thermally cracked into molecules each having two atoms or into individual atoms which in turn are supplied to the substrate, so that it becomes possible to grow high-quality crystals and furthermore the growth time at a low temperature can be considerably shortened.

As described above with reference to FIGS. 8A-8C, from the standpoint of the recovery of the intensity of RHEED, it is not necessary to make the quantity of a Group III element to be supplied to the substrate completely equal to the quantity required for forming a single atomic layer and no problem arises when the quantity to be supplied to the substrate is between 90 and 100% of the quantity required for forming a single atomic layer. In the case of the self-flattening phenomenon, it has been described that the quantity of the supply of a Group III element is not so greater than the quantity required for forming a single atomic layer and is preferably equal to or less than the coordination number. However, when hydrogen is supplied to the growth surface of a Group III element, the upper limit of the quantity of the supply of a Group III element is considerably relaxed; the control of the supply quantity is simplified; and a more perfect growing surface can be obtained.

Figure 30A:
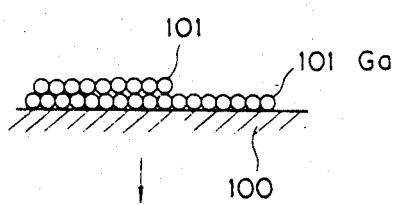
FIGS. 30A and 30B are schematic views used to explain the effects obtained by the irradiation of hydrogen.
Figure 30B:
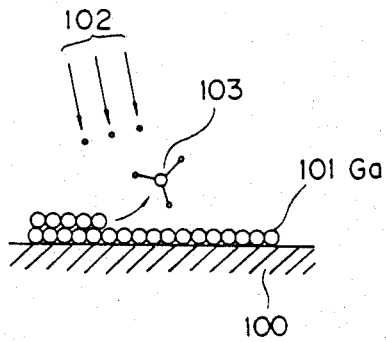

First the effects attained by supplying the hydrogen to the growing surface will be schematically described. As shown in FIG. 30A, atoms 101 of Group III are supplied to a substrate 100 in a quantity 100-200% greater than the quantity required for forming a single atomic layer and then hydrogen 102 is made to irradiate the atomic layers in a quantity of 50-100 times the quantity of the Group III element supplied to the substrate. Then, excess atoms of Group III are evaporated from the growing surface in the form of a hydride 103 as schematically shown in FIG. 30B. In this case, the reason why the first atomic layer is not evaporated is that it is maintained in a state more stable than the state of the second atomic layer because of the combination of the first atomic layer with atoms of Group V in the lower layer. When the atoms of Group V are supplied to the flat atomic surface of the atoms of Group III, a III-V molecular layer with a flat atomic surface can be obtained. Atoms of Group V have a high vapor pressure, therefore, the V—V combination is easily broken even when no hydrogen is supplied, and a single layer is grown in the atmosphere at a reduced pressure.

In the case of GaAs, As which has a high vapor pressure is evaporated even without the introduction of the hydrogen, but Ga which has a low vapor pressure is hardly vaporized. Therefore, when Ga is deposited on Ga, the former is combined with the hydrogen to form a hydride and then removed. As a result, only one Ga atomic layer remains on the As atomic layer. In like manner, in the cases of AlAs, InAs, InP or GaP, the vapor pressures of Ga, Al and In are considerably lower than those of As and P, it becomes possible to form one atomic layer of Ga, Al or In by the introduction of the hydrogen. Another atomic layer of As or P is deposited on the atomic layer of Ga, Al or In. These steps are repeated so that epitaxial growth in which atomic layers are sequentially grown on top of each other can be realized.

Figure 31A:
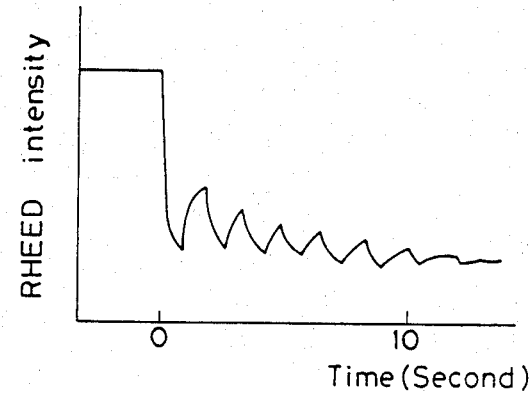
FIGS. 31A and 31B show the variations in time of the intensities of RHEED of GaAs crystals grown by increasing the quantity of Ga atom supply and grown by supplying the hydrogen to the surface of Ga atoms supplied excessively, respectively.
Figure 31B:
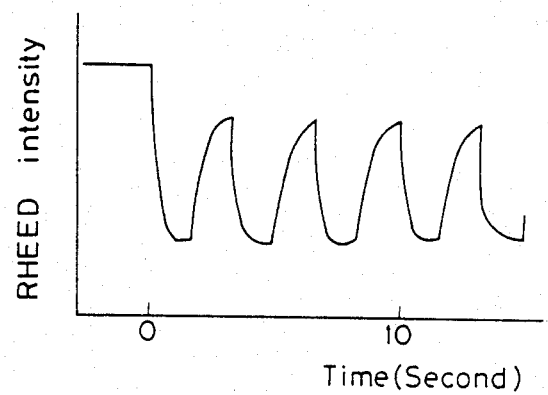
Figure 32A:
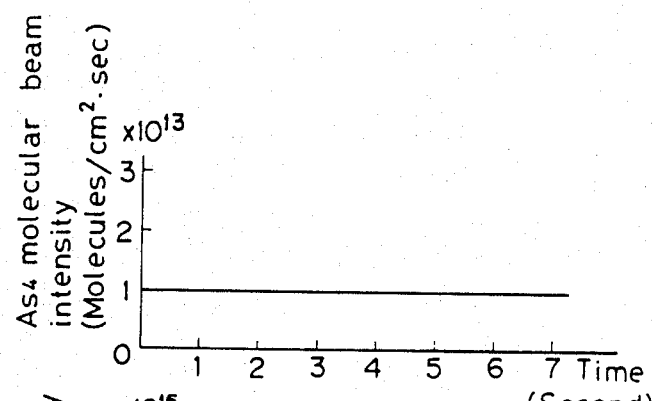
FIGS. 32A, 32B, 32C and 32D are timing charts illustrating the timing of the normally supplies As and the timing of the supplies of Ga, As and H which are intermittently supplied in a predetermined order, respectively.
Figure 32B:
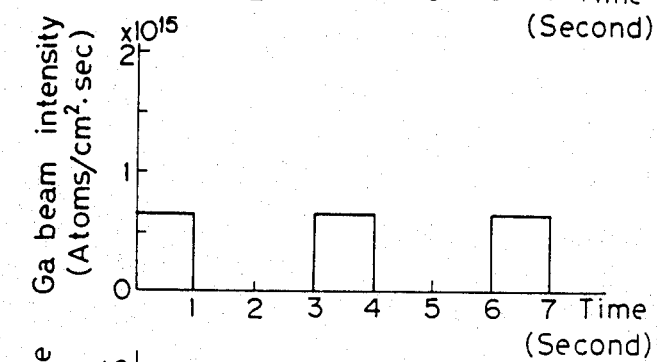
Figure 32C:
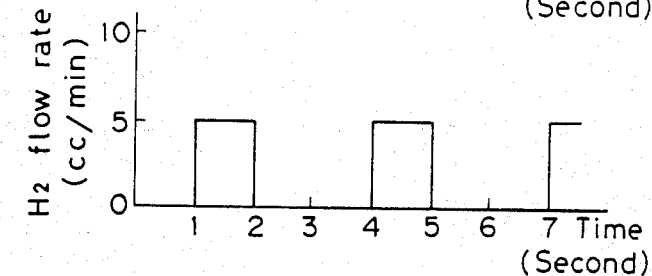
Figure 32D:
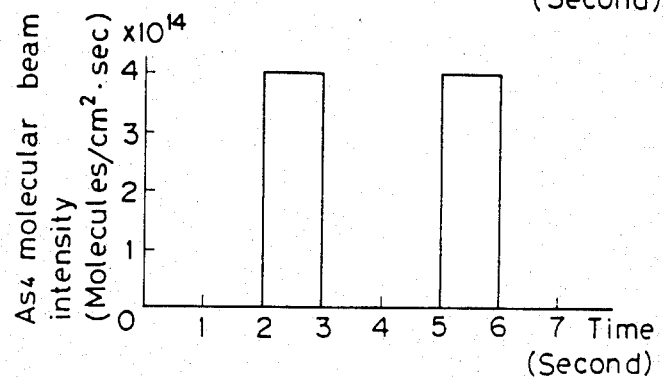

When the apparatus as shown in FIG. 4 was used and when Ga and As were alternately supplied to a substrate maintained at 580° C. in accordance with the time charts shown in FIGS. 5A and 5B except that the Ga supply quantity is 150% of the quantity required for forming one atomic layer, the oscillations of RHEED disappeared after tens of periods as shown in FIG. 31A. However, the hydrogen gas was made to irradiate the substrate crystal at a flow rate of 5cc/min for one second as shown in FIGS. 32A-32D, the intensity of RHEED was recovered as shown in FIG. 31B and the oscillations continued for a long period of time. It is postulated that the introduced hydrogen reacts with excessively adsorbed Ga to form a hydride which in turn is removed away from the surface of the substrate. In this case, the adsorbed Ga atoms forming one atomic layer are combined with the As atoms in the lower layer, so that the Ga atoms in the atomic layer cannot be removed by this process. Thus, it becomes possible to grow one atomic layer in a strict sense.

The flow rate of the hydrogen gas may be so selected that the number of the hydrogen atoms supplied to the substrate are 50-100 times as many as the number of the Ga atoms in one atomic layer, and even when the supply of Ga atoms is increased by 200% of the number of atoms required for forming a single atomic layer, the flatness of the Ga surface on a scale of an atom can be maintained by the irradiation of the hydrogen. It suffices to irradiate the hydrogen for about one second per period of the supply of Ga.

Figure 33:
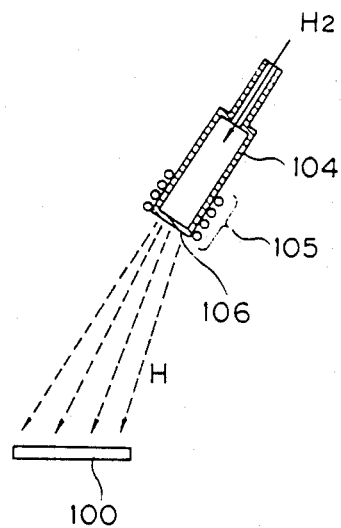
FIG. 33 is a schematic view used to explain a method for supplying the hydrogen atoms to a substrate.

The hydrogen which is irradiated on the Ga surface may be in the form of a molecule, but more pronounced effects can be attained when the hydrogen atoms are used. FIG. 33 shows a method for generating the hydrogen atoms. In FIG. 33, reference numeral 100 represents a substrate disposed in a process chamber; 104, a hydrogen introduction pipe; 105, a heater; and 106, a palladium (Pd) film maintained at about 400° C. A hydrogen molecule $H_2$ which is introduced into the introduction pipe is adsorbed by the Pd film and decomposed into H atoms. Since the H atoms are small in size, they are diffused through the Pd film and injected into the process chamber evacuated to a high degree of vacuum, irradiating the substrate 100. The power of reaction of the hydrogen atoms is very strong, so that the Ga atoms in the two layer structure can be efficiently removed as shown in FIGS. 30A and 30B.

As described above, the Ga atom supply quantity is 90-110% of the quantity required for forming one atomic layer when no hydrogen is irradiated, but when the hydrogen is irradiated after the formation of the Ga layer, a flat atomic surface can be formed even when the Ga supply is increased by 200% of the quantity required for forming one atomic layer.

In the supply process described above with reference to FIGS. 20A and 20B, the hydrogen can be irradiated after the supply of Ga is temporarily interrupted and then the Ga supply can be resumed.

As described above, according to the method of the present invention, a flat atomic surface of atoms of Group III is formed by utilizing the high mobility of the atoms of Group III elements; a III-V compound is formed by supplying atoms or molecules of Group V to the flat atomic surface; and hydrogen is irradiated over the atomic surface after the formation of the atomic surface of atoms of Group III, whereby a more perfect atomic surface can be obtained.

INDUSTRIAL APPLICABILITY

According to the present invention, in the case of forming or growing a III-V compound semiconductor by supplying an element in the form of atoms or molecules of Group III and an element in the form of atoms or molecules of Group V of the periodic table to a substrate which is disposed in a vacuum process chamber and is heated, while a Group V element is normally supplied to a substrate, the quantity of supply of a Group V element is decreased to such a level that the growth of the III-V compound semiconductor is interrupted at least one time point of the growth of the III-V compound and such small quantity of the Group V element and the Group III element are simultaneously supplied to the substrate. According to the present invention, in order to accomplish the epitaxial growth of high-quality crystals, the fast migration of materials to be supplied to the growing surface of the crystal is an essential factor and the growth of the III-V compound semiconductor is carried out not by the slow migration of III-V molecules but by the fast migration of atoms of Group III, so that the fast migration over the growing surface can be ensured. Therefore, it becomes possible to grow a high-quality epitaxial layer on a substrate maintained at low temperatures and furthermore it also becomes possible to form flat heterojunction interfaces. In addition, a very small quantity of the Group V element is supplied during the period when the Group III element is supplied, so that the evaporation of the Group V element from the regions adjacent to the grown surface can be prevented. As a result, it becomes possible to grow epitaxial crystals having a high degree of purity.

Especially, due to controlling the quantity of the supply of the Group III element during the period of the supply of the Group III element or during the period when the quantity of the supply of the Group V element is decreased, to decrease to a quantity required for forming one atomic surface or a quantity not sufficient to form one atomic surface not only the growing surface but also the surface of the substrate are self-flattened, whereby a flat grown surface and flat heterojunction interfaces on a scale of an atom can be obtained.

Furthermore, by switching the supply of a Group V element between a high intensity mode and a low intensity mode after a compound semiconductor has been grown by simultaneously supplying a Group III element and a Group V element, a flat grown surface and flat heterojunction interfaces can be obtained.

In addition, the quality of grown crystals can be improved by thermally cracking a Group V element before the element is supplied to the substrate. Moreover, by supplying hydrogen to the atomic surface of a Group III element a multilayer structure of the Group III element can be removed, whereby the grown surface can be flattened and the qualities of the grown crystal can be improved.

According to the present invention, it becomes possible to grow a thin III-V compound semiconductor film while minimizing impurities and lattice defects and having high quality, on a substrate maintained at a low temperature. Furthermore, the grown surface and the heterojunction interfaces can be flattened on an atomic scale and the growth rate can be increased.

Therefore, the present invention can be effectively applied to the fabrication of super-high-speed electronic devices, various optical devices such as laser diodes and so on and novel electronic devices utilizing a superlattice.

We claim:

1. A method for forming a thin compound semiconductor film on the surface of a substrate, said substrate being disposed in a vacuum chamber and heated, by supplying at least one element of Group III and at least one element of Group V of the periodic table in the form of atoms or molecules to the surface of said substrate, thereby forming a thin III-V compound semiconductor film, comprising:

a first step of supplying said at least one element of Group III together with said at least one element of Group V to the substrate surface in a first amount, the partial pressure of said at least one element of Group V in said vacuum chamber being within the range from the equilibrium dissociation vapor pressure of said element of Group V on the substrate surface to a pressure equal to ten times said equilibrium dissociation vapor pressure;

a second step of supplying said at least one element of Group V to the substrate surface in a second amount different from said first amount and sufficient to react with said at least one element of group III present on the substrate surface, said second step being performed without supplying any said elements of Group III; and alternating said first and second steps at least at one stage of the growth of said thin compound semiconductor film, thereby producing a III-V compound on the surface of said substrate, and continuously supplying an element of Group V to said substrate in at least an amount sufficient to prevent the evaporation of the element of Group V from a previously grown thin compound semiconductor film, but insufficient to combine with any Group III element on the substrate to produce a compound.

2. A method for forming a thin compound semiconductor film on the surface of a substrate by supplying at least one element of Group III and at least one element of Group V of the periodic table in the form of atoms or molecules to said surface of said substrate disposed in a vacuum chamber and heated, thereby forming a thin III-V compound semiconductor film, comprising:

a first step of continuously supplying said at least one element of Group V to said substrate in a first amount which is such that a partial pressure of said at least one element of Group V in said vacuum chamber is within a range from the equilibrium dissociation vapor pressure of said at least one element of Group V on the substrate surface to the pressure equal to ten times said equilibrium dissociation vapor pressure;

a second step of supplying an amount of said at least one element of Group III to the substrate;

a third step of supplying said at least one element of Group V in a second amount different from said first amount and sufficient to react with said at least one element of Group III, said third step being performed without supplying any said element of Group III; and alternating said second and said third steps during said first step, thereby producing a III-V compound on the surface of said substrate.

3. A method for forming a thin compound semiconductor film as claimed in claim 2, wherein the amount of the supply of at least one element of Group III in the second step is 90–110% of an amount required for forming one atomic plane.

4. A method for forming a thin compound semiconductor film as claimed in claim 2, wherein said second amount of at least one element of Group V is in a range from the number of atoms required for forming one atomic plane to five times said number of atoms.

5. A method for forming a thin compound semiconductor film as claimed in claim 2, wherein Si is supplied as a doping element to said surface of said substrate together with said second amount of at least one element of Group III in the second step.

6. A method for forming a thin compound semiconductor film as claimed in claim 2, wherein at least one of said first and second amounts of one element of Group V is thermally cracked and then supplied to the surface of said substrate.

7. A method for forming a thin compound semiconductor film as claimed in claim 2, wherein a hydride of said at least one element of Group V is thermally cracked so that at least one of said first and second amounts of at least one element of Group V is supplied in the form of atoms.

8. A method for forming a thin compound semiconductor film as claimed in claim 2, wherein an amount of hydrogen is supplied to the surface of said substrate immediately after the second step.

9. A method for forming a thin compound semiconductor film as claimed in claim 8, wherein said hydrogen is in the form of atoms.

10. A method for forming a thin compound semiconductor film as claimed in claim 8, the amount of said hydrogen is 50–100 times as much as the number of atoms of one atomic plane on the substrate of said at least one element of Group III.

11. A method for forming a thin compound semiconductor film as claimed in claim 8, wherein the amount of the supply of said at least one element of Group III in the second step is 90–200% of an amount required for forming one atomic plane.

12. A method for forming a thin compound semiconductor film as claimed in claim 2, wherein said substrate is maintained at a temperature between 100° and 700° C.

13. A method for forming a thin compound semiconductor film as claimed in claim 2, wherein said first, second and third steps are carried out at least one of immediately before and after a separate step of continuously supplying an amount of at least one element of Group III together with an amount of at least one element of Group V to said substrate, said amount of at least one Group V element being sufficient to combine with said amount of at least one element of Group III, thereby producing a III-V compound on said substrate.

14. A method for forming a thin compound semiconductor film on the surface of a substrate disposed in a vacuum chamber and heated, by supplying at least one element of Group III and at least one element of Group V of the periodic table in the form of atoms or molecules to the surface of said substrate, thereby forming a thin III-V compound semiconductor film, comprising:

a first step of supplying said at least one element of Group V in a first amount, which is such that a partial pressure of said at least one element of Group V in said vacuum chamber is within a range from the equilibrium dissociation vapor pressure of said at least one element of Group V on the substrate surface to the pressure equal to ten times said equilibrium dissociation vapor pressure;

a second step of supplying said at least one element of Group V in a second amount sufficient to react with said at least one element of Group III; and repeating said first and second steps, simultaneously during a third step of continuously supplying an amount of said at least one element of Group III to the surface of the substrate thereby producing a III-V compound on the surface of said substrate.

15. A method for forming a thin compound semiconductor film as claimed in claim 14, wherein said second amount of said at least one element of Group V is within a range from the number of atoms required for forming one atomic surface to 5 times a number of atoms required for forming one atomic plane on said substrate.

16. A method for forming a thin compound semiconductor film as claimed in claim 14, wherein Si is supplied as a doping element to said surface of said substrate together with said amount of at least one element of Group III.

17. A method for forming a thin compound semiconductor film as claimed in claim 14, wherein at least one of said first and second amounts of said at least one element of Group V is thermally cracked and supplied to said surface of said substrate.

18. A method for forming a thin compound semiconductor film as claimed in claim 14, wherein a hydride of said at least one element of Group V is thermally cracked so that at least one of said first and second amounts of at least one element of Group V is supplied in the form of atoms.

19. A method for forming a thin compound semiconductor film as claimed in claim 14, wherein said substrate is maintained at a temperature between 100° and 700° C.

20. A method for forming a thin compound semiconductor film as claimed in claim 14, wherein said first, second and third steps are carried out at least one of immediately before and immediately after a separate step of continuously supplying to said substrate surface an amount of at least one element of Group III and at least one element of Group V in an amount sufficient to react with said amount of at least one element of Group III, thereby producing a III-V compound on said substrate.

* * * * *